United States Patent

Frost

(10) Patent No.: US 12,550,340 B2
(45) Date of Patent: Feb. 10, 2026

(54) THREE-DIMENSIONAL METAL-INSULATOR-METAL CAPACITORS

(71) Applicant: Intel Corporation, Santa Clara, CA (US)

(72) Inventor: Denzil Frost, Rio Rancho, ID (US)

(73) Assignee: Intel Corporation, Santa Clara, CA (US)

( * ) Notice: Subject to any disclaimer, the term of this patent is extended or adjusted under 35 U.S.C. 154(b) by 188 days.

(21) Appl. No.: 18/333,470

(22) Filed: Jun. 12, 2023

(65) Prior Publication Data

US 2024/0413194 A1    Dec. 12, 2024

(51) Int. Cl.
*H01G 4/30* (2006.01)
*H01L 21/02* (2006.01)
*H10D 1/00* (2025.01)
*H10D 1/68* (2025.01)

(52) U.S. Cl.
CPC ............. *H10D 1/042* (2025.01); *H10D 1/716* (2025.01)

(58) Field of Classification Search
CPC .......... H10D 1/042; H10D 1/68; H10D 1/043; H10D 1/716
See application file for complete search history.

(56) References Cited

U.S. PATENT DOCUMENTS

| | | | |
|---|---|---|---|
| 9,385,039 B2 | 7/2016 | Sakuma | |
| 9,536,784 B1 | 1/2017 | Farooq et al. | |
| 9,847,255 B2 | 12/2017 | Lin et al. | |
| 10,181,454 B2 | 1/2019 | Park | |
| 2010/0052099 A1 | 3/2010 | Chang et al. | |
| 2010/0295110 A1* | 11/2010 | Takaishi | H10B 12/315 257/E27.084 |
| 2012/0168902 A1 | 7/2012 | Zhu et al. | |
| 2014/0235019 A1 | 8/2014 | Tzeng et al. | |
| 2018/0158897 A1 | 6/2018 | Gong et al. | |
| 2019/0096587 A1 | 3/2019 | Shin et al. | |
| 2021/0375551 A1 | 12/2021 | Park | |

OTHER PUBLICATIONS

Lin, H et al "91.5%-Efficiency Fully Integrated Voltage Regulator with 86fF/μm/\2-High Density 2.5D MIM Capacitor", 2021 Symposium on VLSI Technology Digest of Technical Papers, 2021, 2 pages.

* cited by examiner

*Primary Examiner* — John A Bodnar
(74) *Attorney, Agent, or Firm* — Akona IP PC

(57) ABSTRACT

Disclosed herein are IC devices with three-dimensional metal-insulator-metal capacitor structures. An example IC device implementing such capacitor structures includes studs of a first insulator material, an insulator material surrounding and in contact with upper-most portions of sidewalls of the studs, a first electrically conductive material surrounding bottom-most portions of the sidewalls of the studs, and a second electrically conductive material surrounding middle portions of the sidewalls of the studs, wherein the insulator material further surrounds the second electrically conductive material over the middle portions of the sidewalls of the studs. The IC device further includes a third electrically conductive material surrounding the insulator material surrounding the middle portions and the upper-most portions of the studs.

20 Claims, 16 Drawing Sheets

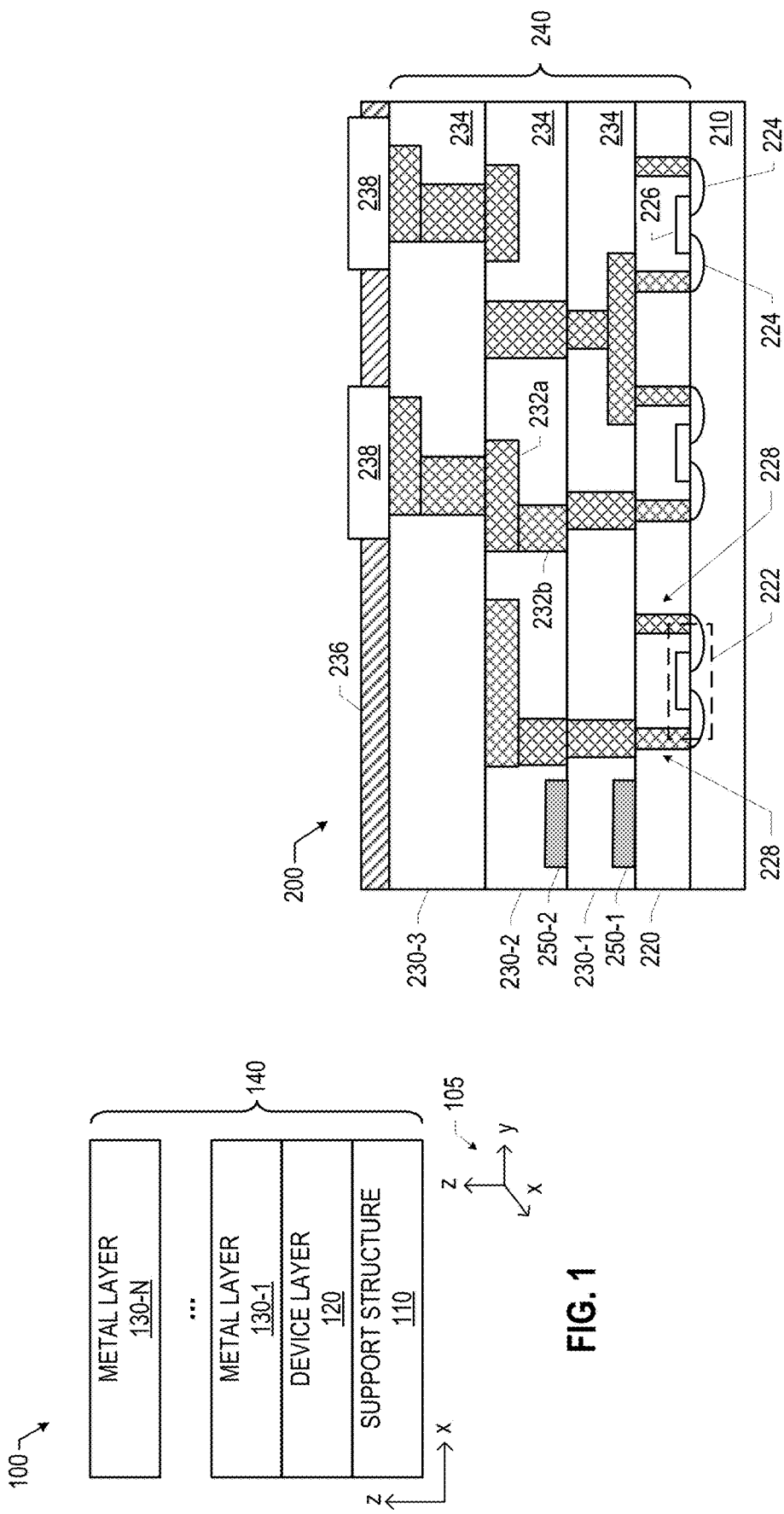

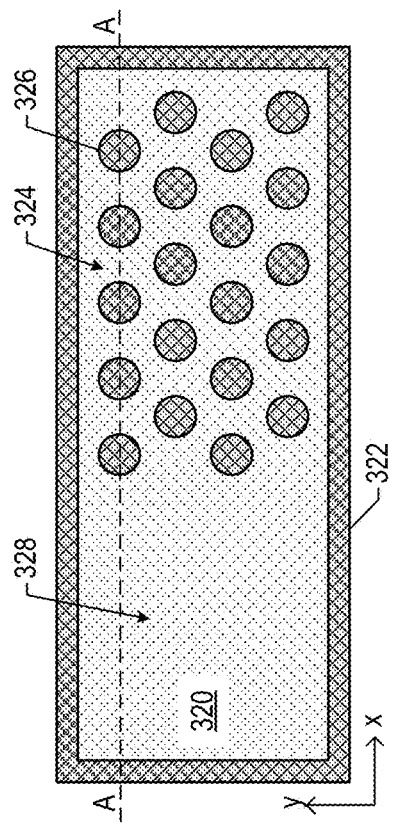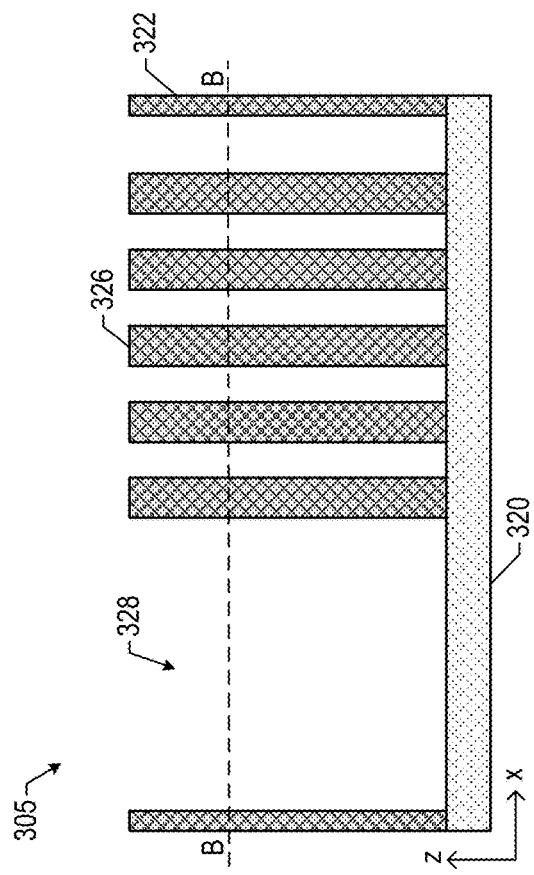
FIG. 5
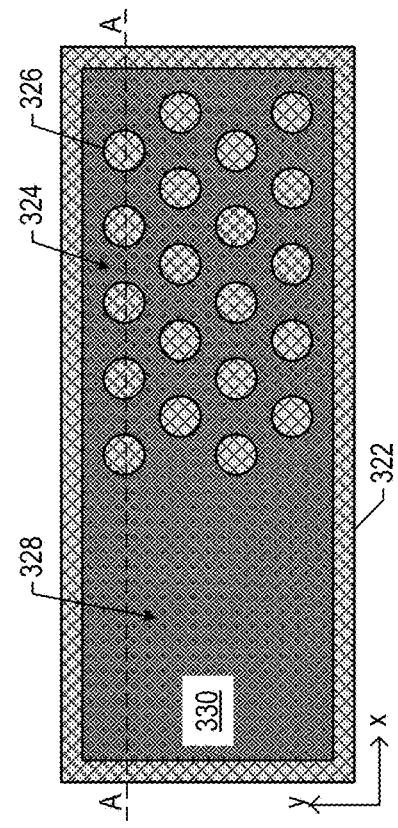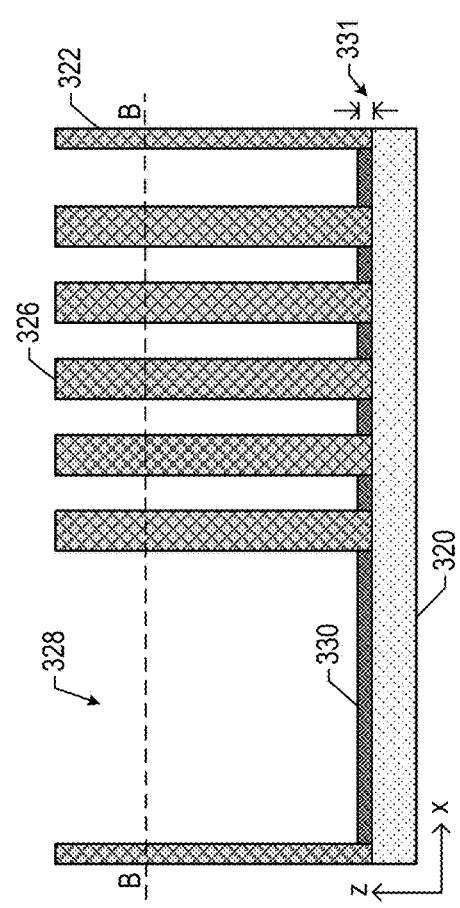
FIG. 6

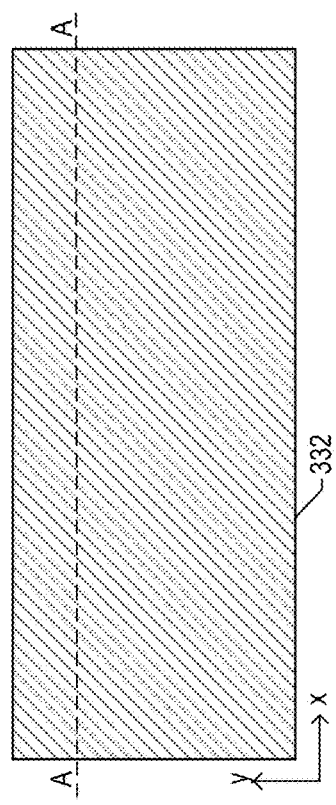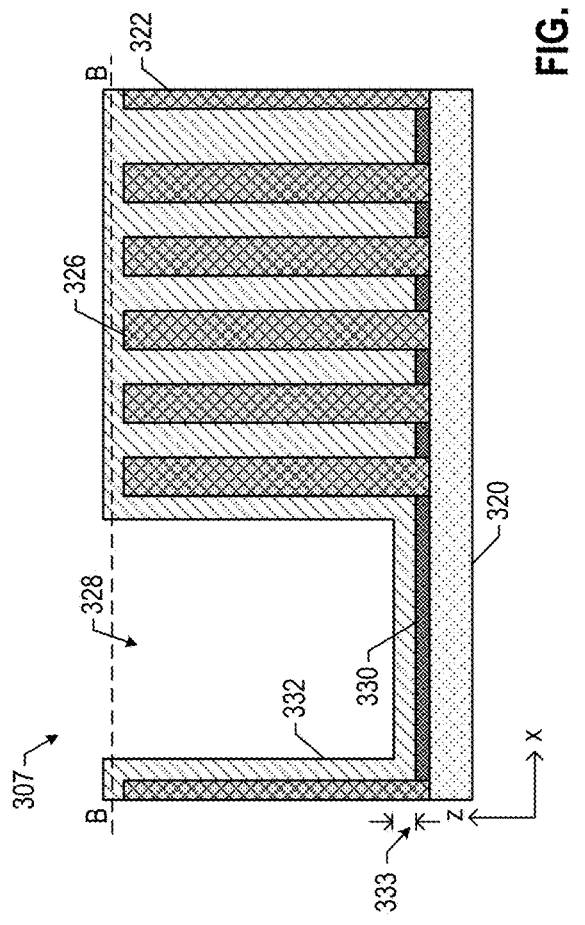
FIG. 7
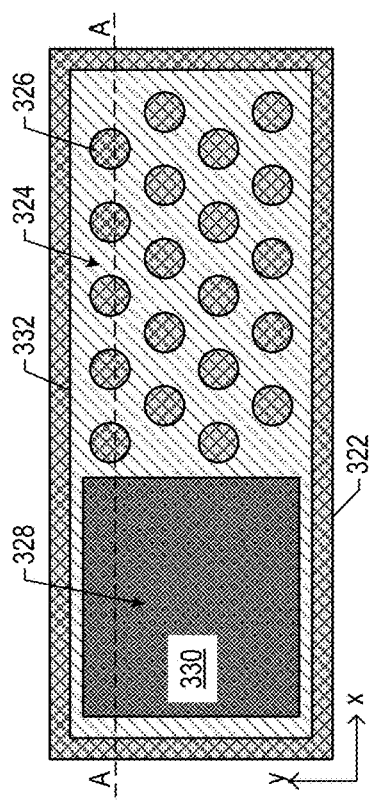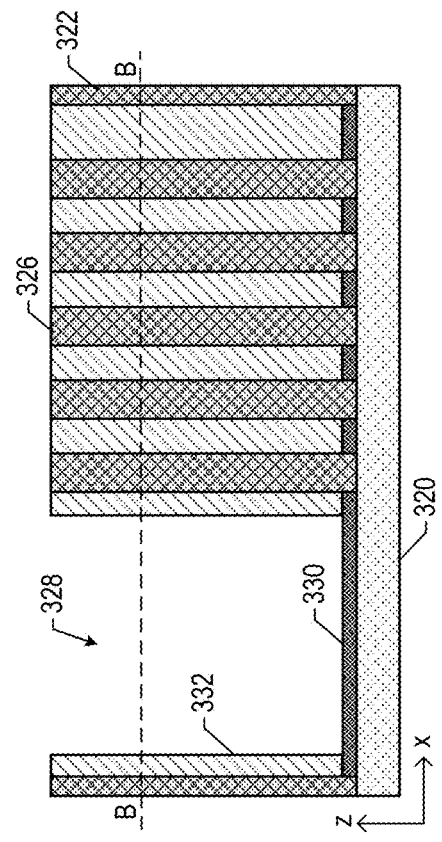
FIG. 8

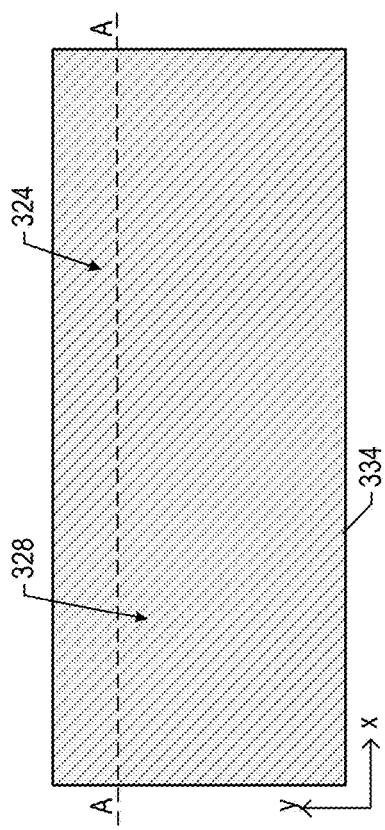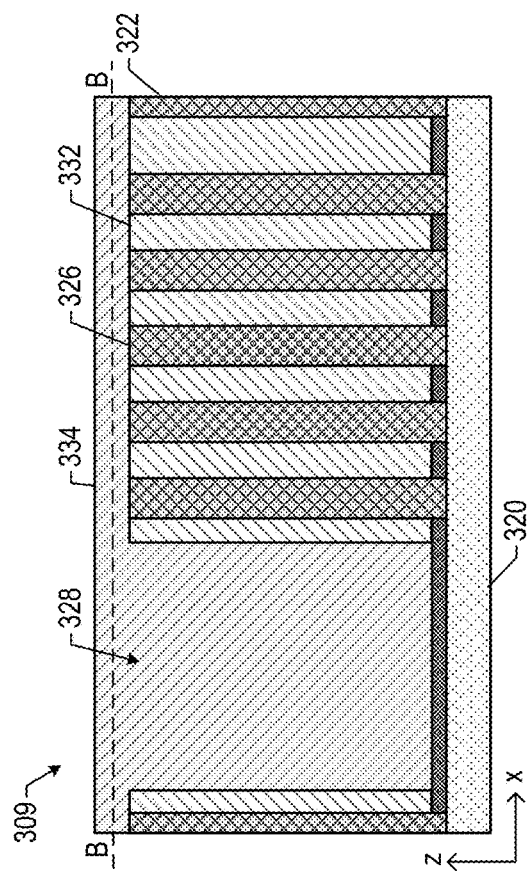
FIG. 9
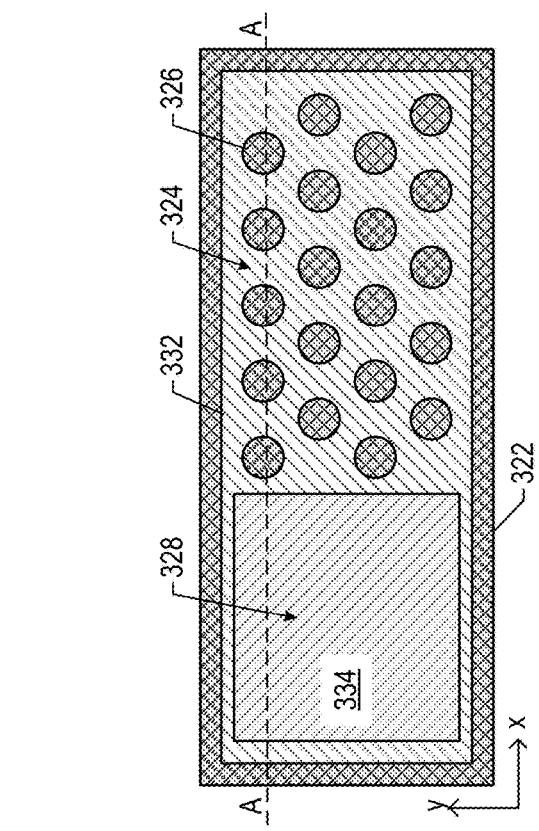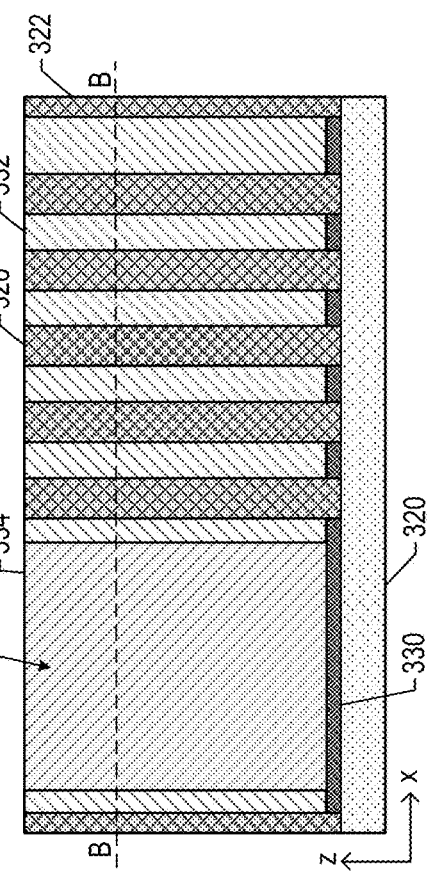
FIG. 10

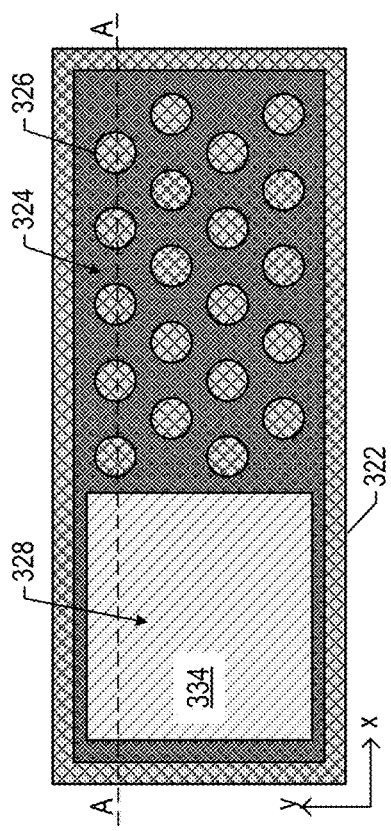
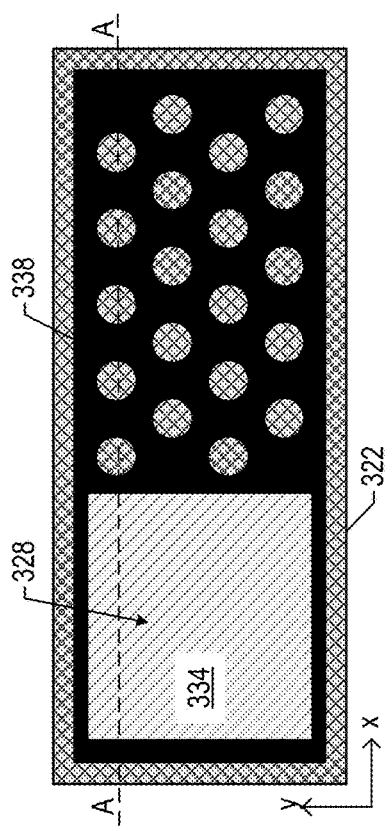
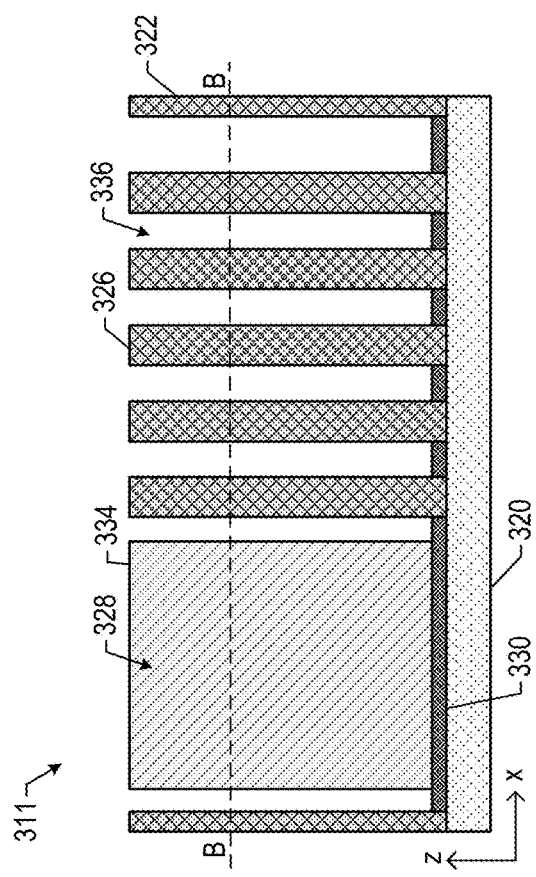
FIG. 11
FIG. 12

THREE-DIMENSIONAL METAL-INSULATOR-METAL CAPACITORS

BACKGROUND

For the past several decades, the scaling of features in integrated circuits has been a driving force behind an ever-growing semiconductor industry. Scaling to smaller and smaller features enables increased densities of functional units on the limited real estate of semiconductor chips. For example, shrinking transistor size allows for the incorporation of an increased number of memory or logic devices on a chip, lending to the fabrication of products with increased capacity. The drive for the ever-increasing capacity, however, is not without issue. The necessity to optimize fabrication and performance of each component becomes increasingly significant.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example, and not by way of limitation, in the figures of the accompanying drawings.

FIG. 1 illustrates a cross-sectional view of an example integrated circuit (IC) device in which one or more three-dimensional (3D) metal-insulator-metal (MIM) capacitor structures may be implemented, according to some embodiments of the present disclosure.

FIG. 2 illustrates a cross-sectional side view of an example IC device that may include one or more 3D MIM capacitor structures in accordance with any of the embodiments disclosed herein.

FIGS. 3-19 illustrate cross-sectional side and top-down views of an example IC device during fabrication of 3D MIM capacitor structures, according to some embodiments of the present disclosure.

DETAILED DESCRIPTION

Figure 3:
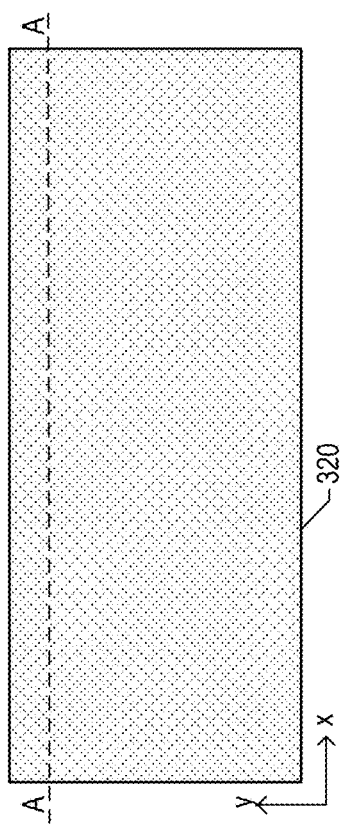

Disclosed herein are IC devices with 3D MIM capacitor structures. An example IC device implementing such capacitor structures includes studs of a first insulator material (e.g., an insulator material 322) over the support structure; an insulator material (e.g., a capacitor insulator 340) surrounding and in contact with upper-most portions of sidewalls of the studs; a first electrically conductive material (e.g., an electrically conductive material 330) surrounding bottom-most portions of the sidewalls of the studs; and a second electrically conductive material (e.g., an electrically conductive material 338) surrounding middle portions of the sidewalls of the studs, wherein the middle portions are between the bottom-most portions and the upper-most portions, wherein the insulator material further surrounds the second electrically conductive material over the middle portions of the sidewalls of the studs. The IC device further includes a third electrically conductive material (e.g., an electrically conductive material 342) surrounding the insulator material surrounding the middle portions and the upper-most portions of the studs.

MIM capacitors currently used in the industry require at least one patterning step per capacitor electrode because each capacitor electrode needs an independent connection to the power delivery network. Each patterning step increases costs. 3D MIM capacitor structures may allow providing MIM capacitors at a reduced cost due to simpler patterning, while maintaining the ability to provide independent connections between capacitor electrodes and the power delivery network. Furthermore, many MIM capacitors currently used in the industry are planar in structure. Because capacitor structures proposed herein are 3D, they offer higher capacitance per unit area compared to planar capacitor structures.

In some implementations, 3D MIM capacitor structures described herein may be used as decoupling capacitors. A decoupling capacitor is a capacitor used to decouple one part of an electrical network from another. Noise caused by other circuit elements can be shunted through the decoupling capacitor, reducing the effect it has on the rest of the circuit. Decoupling capacitors are typically included in semiconductor packages in order to lower the inductance through the package by reducing the lead length. Decoupling capacitors placed close to power consuming circuits are able to smooth out voltage variation with charges stored on them. The stored charge either dissipates or is used as a local power supply to device inputs during signal switching stages, allowing the decoupling capacitors to negate the effects of voltage noise induced into the system by parasitic inductance.

In some embodiments, 3D MIM capacitor structures described herein may be moved to the back end of line (BEOL) layers (also referred to as "backend") of an advanced complementary metal-oxide-semiconductor (CMOS) process. In particular, including 3D MIM capacitor structures in a metal layer of a metallization stack above a support (e.g., a substrate, a die, a wafer, or a chip) having active circuitry in the front end of line (FEOL) layer and, possibly, in lower BEOL layers may allow realizing decoupling capacitors with sufficient capacitive decoupling close to the active circuitry of an IC device without occupying valuable die area where active circuitry can be built. As such, 3D MIM capacitor structures described herein may be used to address the scaling challenges of conventional decoupling capacitors and be compatible with advanced CMOS processes. Other technical effects will be evident from various embodiments described here.

Various IC devices with 3D MIM capacitor structures as described herein may be implemented in, or associated with, one or more components associated with an IC or/and may be implemented between various such components. In various embodiments, components associated with an IC include, for example, transistors, diodes, power sources, resistors, capacitors, inductors, sensors, transceivers, receivers, antennas, etc. Components associated with an IC may include those that are mounted on IC or those connected to an IC. The IC may be either analog or digital and may be used in a number of applications, such as microprocessors, optoelectronics, logic blocks, audio amplifiers, etc., depending on the components associated with the IC. The IC may be employed as part of a chipset for executing one or more related functions in a computer.

In the following detailed description, various aspects of the illustrative implementations may be described using terms commonly employed by those skilled in the art to convey the substance of their work to others skilled in the art. For example, the term "connected" means a direct electrical or magnetic connection between the things that are connected, without any intermediary devices, while the term "coupled" means either a direct electrical or magnetic connection between the things that are connected, or an indirect connection through one or more passive or active intermediary devices. The term "circuit" means one or more passive and/or active components that are arranged to cooperate with one another to provide a desired function. If used, the terms "oxide," "carbide," "nitride," etc. refer to compounds containing, respectively, oxygen, carbon, nitrogen, etc., the term "high-k dielectric" refers to a material having a higher dielectric constant (k) than silicon oxide, while the term "low-k dielectric" refers to a material having a lower k than silicon oxide. Although certain elements may be referred to in the singular herein, such elements may include multiple sub-elements. For example, "an insulator material" may include one or more insulator materials. The term "insulating" and variations thereof (e.g., "insulative" or "insulator") means "electrically insulating," the term "conducting" and variations thereof (e.g., "conductive" or "conductor") means "electrically conducting," unless otherwise specified. For example, the term "insulating material" refers to solid materials (and/or liquid materials that solidify after processing as described herein) that are substantially electrically nonconducting. They may include, as examples and not as limitations, organic polymers and plastics, and inorganic materials such as ionic crystals, porcelain, glass, silicon and alumina or a combination thereof. They may include dielectric materials, high polarizability materials, and/or piezoelectric materials. They may be transparent or opaque without departing from the scope of the present disclosure. With reference to optical signals and/or devices, components and elements that operate on or using optical signals, the term "conducting" can also mean "optically conducting."

In the following detailed description, reference is made to the accompanying drawings that form a part hereof wherein like numerals designate like parts throughout, and in which is shown, by way of illustration, embodiments that may be practiced. It is to be understood that other embodiments may be utilized, and structural or logical changes may be made, without departing from the scope of the present disclosure. Therefore, the following detailed description is not to be taken in a limiting sense.

Any of the features discussed with reference to any of accompanying drawings herein may be combined with any other features to form IC devices with 3D MIM capacitor structures, as appropriate. A number of elements of the drawings are shared with others of the drawings; for ease of discussion, a description of these elements is not repeated, and these elements may take the form of any of the embodiments disclosed herein. If multiple instances of certain elements are illustrated, then, in some cases, to not clutter the drawings only some of these elements may be labeled with a reference sign and other ones of these elements are not labeled (e.g., although FIG. 2 illustrates three transistors 222, only one of them is labeled with a reference sign). However, in other cases, for ease of explanation, different instances of a given element in a single drawing may be referred to with numbers 1, 2, and so on, after a dash (e.g., FIG. 2 illustrates two 3D MIM capacitor structures, labeled individually as a first 3D MIM capacitor structure 250-1 and a second 3D MIM capacitor structure 250-2).

The drawings are not necessarily to scale. Although many of the drawings illustrate rectilinear structures with flat walls and right-angle corners, this is simply for ease of illustration and may not reflect real-life process limitations which may cause various features to not look so "ideal" when any of the structures described herein are examined using e.g., scanning electron microscopy (SEM) images or transmission electron microscope (TEM) images. In such images of real structures, possible processing defects could also be visible, e.g., not-perfectly straight edges of materials, tapered vias or other openings, inadvertent rounding of corners or variations in thicknesses of different material layers, occasional screw, edge, or combination dislocations within the crystalline region, and/or occasional dislocation defects of single atoms or clusters of atoms. There may be other defects not listed here but that are common within the field of device fabrication.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B, and C). When used to describe a range of dimensions, the phrase "between X and Y" represents a range that includes X and Y. When used to describe a location of an element, the phrase "between X and Y" represents a region that is spatially between element X and element Y. The description may use the phrases "in an embodiment" or "in embodiments," which may each refer to one or more of the same or different embodiments. The terms "substantially," "close," "approximately," "near," and "about," generally refer to being within +/−20%, e.g., within +/−5% or within +/−2%, of a target value based on the context of a particular value as described herein or as known in the art. Similarly, terms indicating orientation of various elements, e.g., "coplanar," "perpendicular," "orthogonal," "parallel," or any other angle between the elements, generally refer to being within +/−20%, e.g., within +/−5% or within +/−2%, of a target value based on the context of a particular value as described herein or as known in the art.

FIG. 1 illustrates a cross-sectional view of an example IC device 100 in which one or more 3D MIM capacitor structures may be implemented, according to some embodiments of the present disclosure. FIG. 1 illustrates an example coordinate system 105 with axes x-y-z so that the various planes illustrated in FIG. 1 and in some subsequent drawings may be described with reference to this coordinate system.

As shown in FIG. 1, in general, the IC device 100 may include a support structure 110, a device layer 120, and a plurality of metal layers 130, labeled as a metal layer 130-1 through metal layer 130-N, where N is an integer greater than 1. Together, the metal layers 130 may be referred to as a metallization stack 140. The illustration of FIG. 1 is intended to provide a general orientation and arrangement of various layers with respect to one another, and, unless specified otherwise in the present disclosure, includes embodiments of the IC device 100 where portions of elements described with respect to one of the layers shown in FIG. 1 may extend into one or more, or be present in, other layers.

The support structure 110 may be any suitable support over which the device layer 120 and the metallization stack 140 may be provided. For example, the support structure 110 may be a substrate, a die, a wafer or a chip. The support structure 110 may, e.g., be the wafer 2000 of FIG. 20, discussed below, and may be, or be included in, a die, e.g., the singulated die 2002 of FIG. 20, discussed below. The support structure 110 may be a semiconductor substrate composed of semiconductor material systems including, for example, N-type or P-type materials systems. In one implementation, the semiconductor substrate may be a crystalline substrate formed using a bulk silicon or a silicon-on-insulator (SOI) substructure. In other implementations, the semiconductor substrate may be formed using alternate materials, which may or may not be combined with silicon, that include, but are not limited to, germanium, silicon germanium, indium antimonide, lead telluride, indium arsenide, indium phosphide, gallium arsenide, aluminum gallium arsenide, aluminum arsenide, indium aluminum arsenide, aluminum indium antimonide, indium gallium arsenide, gallium nitride, indium gallium nitride, aluminum indium nitride or gallium antimonide, or other combinations of group III-V materials (i.e., materials from groups III and V of the periodic system of elements), group II-VI (i.e., materials from groups II and IV of the periodic system of elements), or group IV materials (i.e., materials from group IV of the periodic system of elements). In some embodiments, the substrate may be non-crystalline. In some embodiments, the support structure 110 may be a printed circuit board (PCB) substrate. Although a few examples of materials from which the substrate may be formed are described here, any material that may serve as a foundation upon which a semiconductor device implementing any of the 3D MIM capacitor structures as described herein may be built falls within the spirit and scope of the present disclosure.

The device layer 120 may include any combination of active ICs provided over the support structure 110. For example, in some embodiments, the device layer 120 may include various logic layers, circuits, and devices (e.g., logic transistors) to drive and control a logic IC. In some embodiments, the device layer 120 may include memory devices/circuits. In some embodiments, the device layer 120 may include one or more 3D MIM capacitor structures as described herein.

Various layers of the metallization stack 140 may be, or include, metal layers of a BEOL. As used herein, the term "metal layer" may refer to a layer above a support structure 110 that includes electrically conductive interconnect structures (e.g., conductive lines and conductive vias) for providing electrical connectivity between different IC components. Metal layers described herein may also be referred to as "metal layers" to clearly indicate that these layers include electrically conductive interconnect structures which may, but does not have to, be metal. Various metal layers of the metallization stack 140 may be used to interconnect the various inputs and outputs of the active devices (e.g., transistors) in the device layer 120. Generally speaking, each of the metal layers of the metallization stack 140 may include a conductive line (also sometimes referred to as a "trench," a "trace," or a "metal line") and/or a conductive via. Conductive lines of a metal layer are configured for transferring signals and power along electrically conductive (e.g., metal) structures extending in the x-y plane (e.g., in the x or y directions), while the conductive vias of a metal layer are configured for transferring signals and power through electrically conductive structures extending in the z-direction, e.g., to any of the adjacent metal layers above or below. Accordingly, conductive vias connect interconnect structures (e.g., conductive lines and/or conductive vias) of one metal layer to interconnect structures of an adjacent metal layer. While referred to as "metal" layers, various layers of the metallization stack 140 may include only certain patterns of conductive metals, e.g., copper (Cu), aluminum (Al), tungsten (W), or cobalt (Co), or metal alloys, or more generally, patterns of an electrically conductive material, formed in an insulating medium such as an interlayer dielectric (ILD). The insulating medium may include any suitable ILD materials such as silicon oxide, carbon-doped silicon oxide, silicon carbide, silicon nitride, aluminum oxide, and/or silicon oxynitride.

One example implementation of the IC device 100 is shown in FIG. 2. FIG. 2 illustrates a cross-sectional side view of an example IC device 200 that may include one or more 3D MIM capacitor structures in accordance with any of the embodiments disclosed herein. The IC device 200 is an example of the IC device 100, as explained below.

Figure 20:
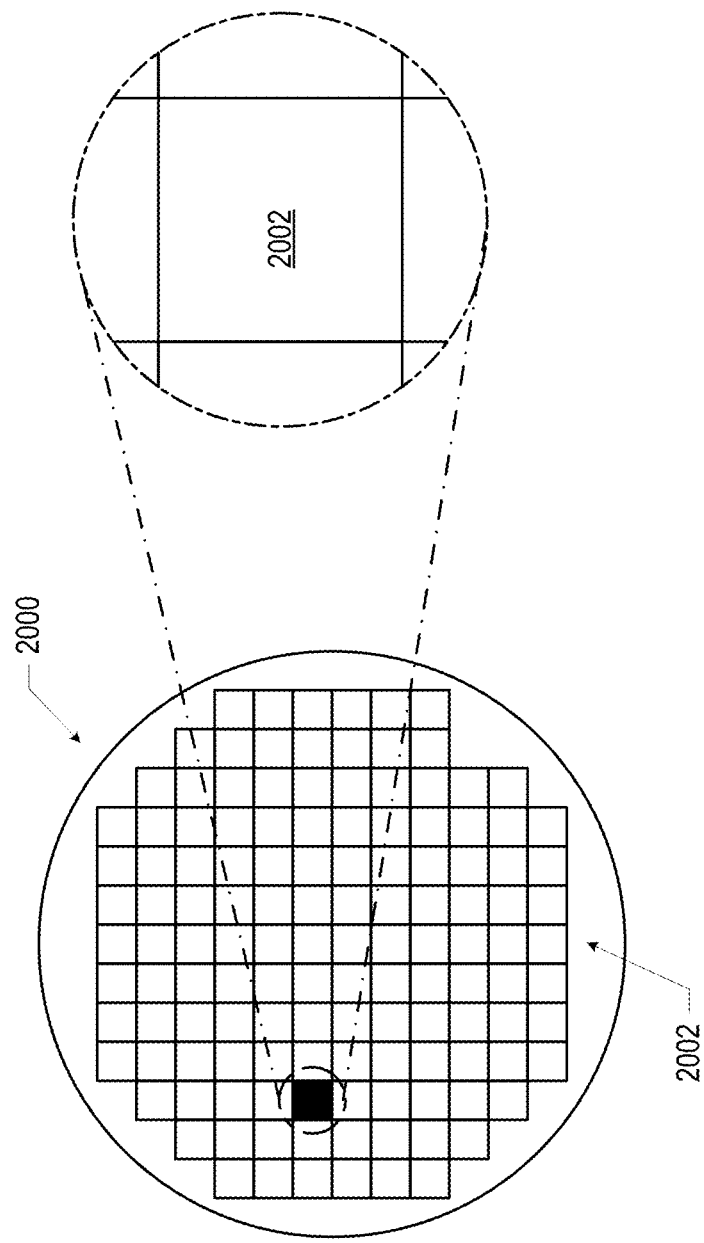
FIG. 20 illustrates top views of a wafer and dies that include one or more 3D MIM capacitor structures in accordance with any of the embodiments disclosed herein.

The IC device 200 may be formed on a substrate 210, where the substrate 210 may be any suitable support structure as described herein, e.g., the support structure 110 of FIG. 1 and/or the wafer 2000 of FIG. 20. The substrate 210 may be part of a singulated die (e.g., the dies 2002 of FIG. 20) or a wafer (e.g., the wafer 2000 of FIG. 20).

The IC device 200 may include one or more device layers 220 disposed on the substrate 210, where, together, the one or more device layers 220 may be an example of the device layer 120 of the IC device 100. The device layer 220 may include features of one or more transistors 222 (e.g., metal-oxide-semiconductor field-effect transistors (MOSFETs)) formed on the substrate 210. The device layer 220 may include, for example, one or more source and/or drain (S/D) regions 224, a gate 226 to control current flow in the transistors 222 between the S/D regions 224, and one or more S/D contacts 228 to route electrical signals to/from the S/D regions 224. The transistors 222 may include additional features not depicted for the sake of clarity, such as device isolation regions, gate contacts, and the like. The transistors 222 are not limited to the type and configuration depicted in FIG. 2 and may include a wide variety of other types and configurations such as, for example, planar transistors, non-planar transistors, or a combination of both. Non-planar transistors may include FinFET transistors, such as double-gate transistors or tri-gate transistors, and wrap-around or all-around gate transistors, such as nanoribbon and nanowire transistors.

The S/D regions 224 may be formed within the substrate 210 adjacent to the gate 226 of each transistor 222, using any suitable processes known in the art. For example, the S/D regions 224 may be formed using either an implantation/diffusion process or a deposition process. In the former process, dopants such as boron, aluminum, antimony, phosphorous, or arsenic may be ion-implanted into the substrate 210 to form the S/D regions 224. An annealing process that activates the dopants and causes them to diffuse farther into the substrate 210 may follow the ion implantation process. In the latter process, an epitaxial deposition process may provide material that is used to fabricate the S/D regions 224. In some implementations, the S/D regions 224 may be fabricated using a silicon alloy such as silicon germanium or silicon carbide. In some embodiments, the epitaxially deposited silicon alloy may be doped in situ with dopants such as boron, arsenic, or phosphorous. In some embodiments, the S/D regions 224 may be formed using one or more alternate semiconductor materials such as germanium or a group III-V material or alloy. In further embodiments, one or more layers of metal and/or metal alloys may be used to form the S/D regions 224. In some embodiments, an etch process may be performed before the epitaxial deposition to create recesses in the substrate 210 in which the material for the S/D regions 224 is deposited.

Each transistor 222 may include a gate 226 formed of at least two layers, a gate electrode layer and a gate dielectric layer.

The gate electrode layer may be formed on the gate interconnect support layer and may consist of at least one P-type workfunction metal or N-type workfunction metal, depending on whether the transistor is to be a P-type metal-oxide-semiconductor (PMOS) or an N-type metal-oxide-semiconductor (NMOS) transistor, respectively. In some implementations, the gate electrode layer may consist of a stack of two or more metal layers, where one or more metal layers are workfunction metal layers and at least one metal layer is a fill metal layer. Further metal layers may be included for other purposes, such as a barrier layer or/and an adhesion layer. For a PMOS transistor, metals that may be used for the gate electrode include, but are not limited to, ruthenium, palladium, platinum, cobalt, nickel, and conductive metal oxides, e.g., ruthenium oxide. A P-type metal layer will enable the formation of a PMOS gate electrode with a workfunction that is between about 4.9 electron Volts (eV) and about 5.2 eV. For an NMOS transistor, metals that may be used for the gate electrode include, but are not limited to, hafnium, zirconium, titanium, tantalum, aluminum, alloys of these metals, and carbides of these metals such as hafnium carbide, zirconium carbide, titanium carbide, tantalum carbide, aluminum carbide, tungsten, tungsten carbide. An N-type metal layer will enable the formation of an NMOS gate electrode with a workfunction that is between about 3.9 eV and about 4.2 eV.

In some embodiments, when viewed as a cross-section of the transistor 222 along the source-channel-drain direction, the gate electrode may be formed as a U-shaped structure that includes a bottom portion substantially parallel to the surface of the substrate and two sidewall portions that are substantially perpendicular to the top surface of the substrate. In other embodiments, at least one of the metal layers that form the gate electrode may simply be a planar layer that is substantially parallel to the top surface of the substrate and does not include sidewall portions substantially perpendicular to the top surface of the substrate. In other embodiments, the gate electrode may be implemented as a combination of U-shaped structures and planar, non-U-shaped structures. For example, the gate electrode may be implemented as one or more U-shaped metal layers formed atop one or more planar, non-U-shaped layers. In some embodiments, the gate electrode may consist of a V-shaped structure (e.g., when a fin of a FinFET transistor does not have a "flat" upper surface, but instead has a rounded peak).

Generally, the gate dielectric layer of a transistor 222 may include one layer or a stack of layers, and the one or more layers may include silicon oxide, silicon dioxide, and/or a high-k dielectric material. The high-k dielectric material included in the gate dielectric layer of the transistor 222 may include elements such as hafnium, silicon, oxygen, titanium, tantalum, lanthanum, aluminum, zirconium, barium, strontium, yttrium, lead, scandium, niobium, and zinc. Examples of high-k materials that may be used in the gate dielectric layer include, but are not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate. In some embodiments, an annealing process may be carried out on the gate dielectric layer to improve its quality when a high-k material is used.

Electrical signals, such as power and/or input/output (I/O) signals, may be routed to and/or from the transistors 222 of the device layer 220 through one or more metal layers 230 disposed on the device layer 220, illustrated in FIG. 2 as metal layers 230-1, 230-2, and 230-3. For example, electrically conductive features of the device layer 220 (e.g., the gate 226 and the S/D contacts 228) may be electrically coupled with the interconnect structures 232 of the metal layers 230. Although a particular number of metal layers 230 is depicted in FIG. 2, embodiments of the present disclosure include IC devices having more or fewer metal layers than depicted. The one or more metal layers 230 may form a metallization stack 240 of the IC device 200. The metal layers 230 are examples of the metal layers 130 of the IC device 100, and the metallization stack 240 is an example of the metallization stack 140 of the IC device 100.

The interconnect structures 232 may be arranged within the metal layers 230 to route electrical signals according to a wide variety of designs (in particular, the arrangement is not limited to the particular configuration of interconnect structures 232 depicted in FIG. 2). In some embodiments, the interconnect structures 232 may include conductive lines 232a and/or conductive vias 232b, formed of an electrically conductive material such as a metal. The conductive lines 232a may be arranged to route electrical signals in a direction of a plane that is substantially parallel with a surface of the substrate 210 upon which the device layer 220 is formed. For example, the conductive lines 232a may route electrical signals in a direction in and out of the page from the perspective of FIG. 2. The conductive vias 232b may be arranged to route electrical signals in a direction of a plane that is substantially perpendicular to the surface of the substrate 210 upon which the device layer 220 is formed. In some embodiments, the conductive vias 232b may electrically couple conductive lines 232a of different metal layers 230 together.

A first metal layer 230-1 (referred to as Metal 1 or "M1") may be formed directly on the device layer 220. In some embodiments, the first metal layer 230-1 may include conductive lines 232a and/or conductive vias 232b, as shown. The conductive lines 232a of the first metal layer 230-1 may be coupled with contacts (e.g., the S/D contacts 228) of the device layer 220.

A second metal layer 230-2 (referred to as Metal 2 or "M2") may be formed directly on the first metal layer 230-1. In some embodiments, the second metal layer 230-2 may include conductive vias 232b to couple the conductive lines 232a of the second metal layer 230-2 with the conductive lines 232a of the first metal layer 230-1. Although the conductive lines 232a and the conductive vias 232b are structurally delineated with a line within each metal layer (e.g., within the second metal layer 230-2) for the sake of clarity, the conductive lines 232a and the conductive vias 232b may be structurally and/or materially contiguous (e.g., simultaneously filled during a dual-damascene process) in some embodiments.

A third metal layer 230-3 (referred to as Metal 3 or "M3") (and additional metal layers, as desired) may be formed in succession on the second metal layer 230-2 according to similar techniques and configurations described in connection with the second metal layer 230-2 or the first metal layer 230-1.

The metal layers 230 may include a dielectric material 234 disposed between the interconnect structures 232, as shown in FIG. 2. The dielectric material 234 may take the form of any of the embodiments of the dielectric material provided between the interconnects of the IC structures disclosed herein, for example any of the embodiments discussed herein with reference to the insulating medium of the metallization stack 140. In some embodiments, the dielectric material 234 disposed between the interconnect structures 232 in different ones of the metal layers 230 may have different compositions. In other embodiments, the composition of the dielectric material 234 in different metal layers 230 may be the same.

The IC device 200 may include a solder resist material 236 (e.g., polyimide or similar material) and one or more conductive contacts 238 (e.g., bond pads) formed on the metal layers 230. The conductive contacts 238 may be electrically coupled with the interconnect structures 232 and configured to route the electrical signals of the transistor(s) 222 to other external devices. For example, solder bonds may be formed on the one or more conductive contacts 238 to mechanically and/or electrically couple a chip including the IC device 200 with another component (e.g., a circuit board). The IC device 200 may have other alternative configurations to route the electrical signals from the metal layers 230 than depicted in other embodiments. For example, the conductive contacts 238 illustrated in FIG. 2 as bond pads may be replaced by or may further include other analogous features (e.g., posts) that route the electrical signals to external components.

Any of the metal layers 230 and/or the device layer 220 may include one or more 3D MIM capacitor structures. An example result of this is shown in FIG. 2 with a first 3D MIM capacitor structure 250-1 in the first metal layer 230-1 and a second 3D MIM capacitor structure 250-2 in the second metal layer 230-2. Although a particular number of 3D MIM capacitor structures 250 is depicted in FIG. 2, embodiments of the present disclosure include IC devices having more or fewer 3D MIM capacitor structures than depicted. The 3D MIM capacitor structures 250 may be arranged within the metal layers 230 to serve as capacitors (e.g., decoupling capacitors) according to a wide variety of designs (in particular, the arrangement is not limited to the particular configuration of 3D MIM capacitor structures 250 depicted in FIG. 2). In some embodiments, 3D MIM capacitor structures 250 may be fabricated as MIM capacitors formed as part of the BEOL damascene processing. Although FIG. 2 illustrates individual 3D MIM capacitor structures 250 in respective metal layers 230, in some embodiments, one or more of the 3D MIM capacitor structures 250 may span multiple metal layers 230 (i.e., a single 3D MIM capacitor structure 250 may extend vertically as to have portions in multiple metal layers 230). Furthermore, in some embodiments, one or more of the 3D MIM capacitor structures 250 may span a device layer 220 and one or more metal layers 230 (i.e., a single 3D MIM capacitor structure 250 may extend vertically as to have portions in the device layer 220 and in one or more metal layers 230 adjacent to the device layer 220).

FIGS. 3-19 illustrate cross-sectional side and top-down views of an example IC device during fabrication of 3D MIM capacitor structures, according to some embodiments of the present disclosure. In each of FIGS. 3-19, a cross-sectional side view is the one showing an x-z plane of the coordinate system 105, while a top-down view is the one showing an x-y plane of the coordinate system 105, where the cross-sectional side view is the view across a AA plane indicated with a dashed line in the top-down view and the top-down view is the view across a BB plane indicated with a dashed line in the cross-sectional side view.

Fabrication of 3D MIM capacitor structures may begin with providing an IC device with a support structure over which 3D MIM capacitor structures may be formed. An example result of this is shown in FIG. 3, illustrating an IC device 303 that includes a support structure 320. The support structure 320 may be any suitable support over which 3D MIM capacitor structures as described herein may be provided. In some embodiments, the support structure 320 may be the support structure 110, described above. In some embodiments, a device layer 120 as described above may be included in the support structure 320. In some embodiments, one or more metal layers 130 as described above may be included in the support structure 320.

Figure 4:
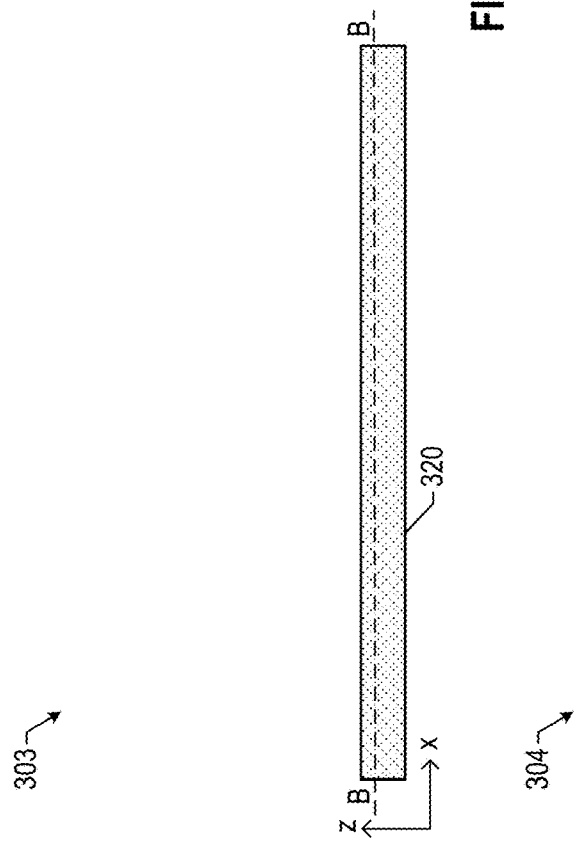

Next, a layer of an insulator material may be provided over the support structure of the IC device 303. An example result of this is shown in FIG. 4, illustrating an IC device 304 that includes a support structure 320 and a layer of an insulator material 322 over the support structure 320. In some embodiments, the insulator material 322 may be an oxide of any suitable semiconductor material, e.g., an oxide of a semiconductor material of the support structure 320. More generally, the insulator material 322 may include any material that may later be shaped into insulator studs (which may also be referred to as "pillars") for supporting 3D MIM capacitor structures described herein. In some embodiments, a thickness 323 of the insulator material 322 (i.e., a dimension measured along the z-axis of the coordinate system 105) may be between about 10 nanometers and 1000 nanometers, including all ranges and values therein, e.g., between about 20 nanometers and 750 nanometers or between about 50 nanometers and 500 nanometers. Any suitable deposition technique may be used to provide a layer of the insulator material 322 of the IC device 304, such as atomic level deposition (ALD), chemical vapor deposition (CVD), physical vapor deposition (PVD), spin-coating, dip-coating, etc.

The fabrication method may then continue with patterning the insulator material of the IC device 304 to form an array of studs of the insulator material as well as a socket for future connection of one of the capacitor electrodes of the 3D MIM capacitor structures. An example result of this is shown in FIG. 5, illustrating an IC device 305 that includes a support structure 320, a layer of an insulator material 322 over the support structure 320, the insulator material 322 patterned to form an array 324 of studs 326 of the insulator material 322 as well as a socket 328 for future connection of one of the capacitor electrodes of the 3D MIM capacitor structures. In various embodiments, any suitable patterning techniques may be used to pattern the insulator material 322 of the IC device 305, such as, but not limited to, photolithographic or electron-beam (e-beam) patterning, possibly in conjunction with a suitable etching technique, e.g., a dry etch, such as e.g., radio frequency (RF) reactive ion etch (RIE) or inductively coupled plasma (ICP) RIE. In some embodiments, the etch performed in a patterning process may include an anisotropic etch, using etchants in a form of, e.g., chemically active ionized gas (i.e., plasma) using e.g., bromine (Br) and chloride (CI) based chemistries. In some embodiments, during the etch of a patterning process, the IC structure may be heated to elevated temperatures, e.g., to temperatures between about room temperature and 200 degrees Celsius, including all values and ranges therein, to promote that byproducts of the etch are made sufficiently volatile to be removed from the surface.

The fabrication method may then continue with depositing a layer of an electrically conductive material at the bottom of the socket 328 and between the studs 326 of the IC device 305. An example result of this is shown in FIG. 6, illustrating an IC device 306 that is substantially the same as the IC device 305 but further includes an electrically conductive material 330 at the bottom of the socket 328 and between the studs 326. In some embodiments, the electrically conductive material 330 may include any conductive metals, e.g., Cu, Al, W, or Co, or metal alloys. In some embodiments, a thickness 331 of the electrically conductive material 330 (i.e., a dimension measured along the z-axis of the coordinate system 105) may be between about 1 nanometer and 100 nanometers, including all ranges and values therein, e.g., between about 2 nanometers and 75 nanometers or between about 5 nanometers and 50 nanometers. Any suitable deposition technique may be used to provide a layer of the electrically conductive material 330 of the IC device 306, e.g., PVD.

Next, a conformal layer of a spacer material may be deposited over the IC device 306. An example result of this is shown in FIG. 7, illustrating an IC device 307 that is substantially the same as the IC device 306 but further includes a spacer material 332 deposited conformally over sidewalls and bottom of the socket 328 and over sidewalls and in between the studs 326. In some embodiments, the spacer material 332 may be an insulator material, e.g., a low-k dielectric material. Examples of the low-k dielectric materials that may be used as the spacer material 332 include, but are not limited to, silicon dioxide, carbon-doped oxide, silicon nitride, fused silica glass (FSG), and organosilicates such as silsesquioxane, siloxane, and organosilicate glass. Other examples of low-k dielectric materials that may be used as the spacer material 332 include organic polymers such as polyimide, polynorbornenes, benzocyclobutene, perfluorocyclobutane, or polytetrafluoroethylene (PTFE). Still other examples of low-k dielectric materials that may be used as the spacer material 332 include silicon-based polymeric dielectrics such as hydrogen silsesquioxane (HSQ) and methylsilsesquioxane (MSQ). In some embodiments, the spacer material 332 may include any insulator materials described herein, e.g., any ILD materials described herein. In some embodiments, a thickness 333 of the spacer material 332 may be between about 1 nanometer and 100 nanometers, including all ranges and values therein, e.g., between about 2 nanometers and 75 nanometers or between about 5 nanometers and 50 nanometers. Any suitable deposition technique may be used to provide a conformal layer of the spacer material 332 of the IC device 307, e.g., PVD.

The fabrication method may then continue with removing the spacer material 332 from the bottom of the socket 328 of the IC device 306. An example result of this is shown in FIG. 8, illustrating an IC device 308 that is substantially the same as the IC device 307 but with a portion of the spacer material 332 removed to expose the electrically conductive material 330 at the bottom of the socket 328. The spacer material 332 may still remain at the sidewalls of the socket 328 and over sidewalls and in between the studs 326. Any suitable etching technique may be used to remove the spacer material 332 from the bottom of the socket 328, e.g., an anisotropic etch. Provided that the spacer material 332 and the electrically conductive material 330 have sufficient etch selectivity with respect to one another, the etch of the spacer material 332 would then stop once the electrically conductive material 330 is exposed. As known in the art, two materials are said to have "sufficient etch selectivity" when etchants used to etch one material do not substantially etch the other, enabling selective etching of one material but not the other. Besides appropriate etching characteristics, some other considerations in selecting a suitable material for the spacer material 332 may include e.g., possibilities of smooth film formation, and low shrinkage and outgassing.

Next, the fabrication method may include depositing an insulator material in all openings and over the IC device 308. An example result of this is shown in FIG. 9, illustrating an IC device 309 that is substantially the same as the IC device 308 but further includes an insulator material 334 in and over the socket 328, as well as in between and over the studs 326. In some embodiments, the insulator material 334 may include any insulator materials described herein, e.g., any ILD materials described herein. Any suitable deposition technique may be used to deposit the insulator material 334 of the IC device 309, such as ALD, CVD, PVD, spin-coating, or dip-coating.

The excess amount of the insulator material 334 may be removed (a process typically referred to as "planarization") to expose the upper surfaces of the studs 326 and the spacer material 332. A result of this is illustrated with an IC device 310 depicted in FIG. 10, where the IC device 310 is substantially the same as the IC device 309 but with the excess portions of the insulator material 334 removed from the top. In various embodiments, planarization of the insulator material 334 may be performed using either wet or dry planarization processes. In one embodiment, planarization of the insulator material 334 may be performed using chemical mechanical planarization (CMP), which may be understood as a process that utilizes a polishing surface, an abrasive and a slurry to remove the overburden and planarize the surface of an IC structure to expose surfaces of materials and structures under the insulator material 334. In other embodiments, a timed anisotropic etch may be used during planarization of the insulator material 334.

The fabrication method may then continue with removing the remaining spacer material 332 from the IC device 310. An example result of this is shown in FIG. 11, illustrating an IC device 311 that is substantially the same as the IC device 310 but with all exposed portions of the spacer material 332 being removed, thus forming openings 336 where the spacer material 332 used to be (e.g., on the sidewalls of the socket 328 and between the studs 326). FIG. 11 illustrates that, as a result of removing remaining portions of the spacer material 332, the electrically conductive material 330 is exposed at the bottoms of the openings 336, in particular, the electrically conductive material 330 is exposed at the bottoms of the openings 336 between the studs 326. Any suitable etching technique may be used to remove all of the exposed spacer material 332, e.g., a wet etch. Provided that the spacer material 332 has sufficient etch selectivity with the insulator material 322 of the studs 326, the electrically conductive material 330, and the insulator material 334, removal of the spacer material 332 should not substantially etch the insulator material 322 of the studs 326, the electrically conductive material 330, and the insulator material 334.

Next, the fabrication method may include depositing a layer of an electrically conductive material on all exposed surfaces of the IC device 311. An example result of this is shown in FIG. 12, illustrating an IC device 312 that is substantially the same as the IC device 311 but further includes an electrically conductive material 338 conformally deposited on all exposed surfaces (i.e., in and over the openings 336). Because the electrically conductive material 330 was exposed in some portions of the IC device 311, in particular at the bottoms of the openings 336 between the studs 326, the electrically conductive material 338 of the IC device 312 may be in contact with the electrically conductive material 330 in those portions, thus forming an electrically continuous electrically conductive layer. Later on, the electrically conductive material 338 on the sidewalls of the studs 326 and at the bottoms of the openings 336 between the studs 326 will become a first capacitor electrode of the 3D MIM capacitor structures. In some embodiments, the electrically conductive material 338 may include any conductive metals, e.g., Cu, Al, W, or Co, or metal alloys, and may have a material composition that is either substantially the same as or different from that of the electrically conductive material 330. In some embodiments, a thickness of the electrically conductive material 338 may be between about 1 nanometer and 20 nanometers, including all ranges and values therein, e.g., between about 1 nanometer and 10 nanometers or between about 2 nanometers and 5 nanometers. Any suitable deposition technique may be used to provide a conformal layer of the electrically conductive material 338 of the IC device 312, e.g., ALD, CVD, or PVD.

Figure 13:
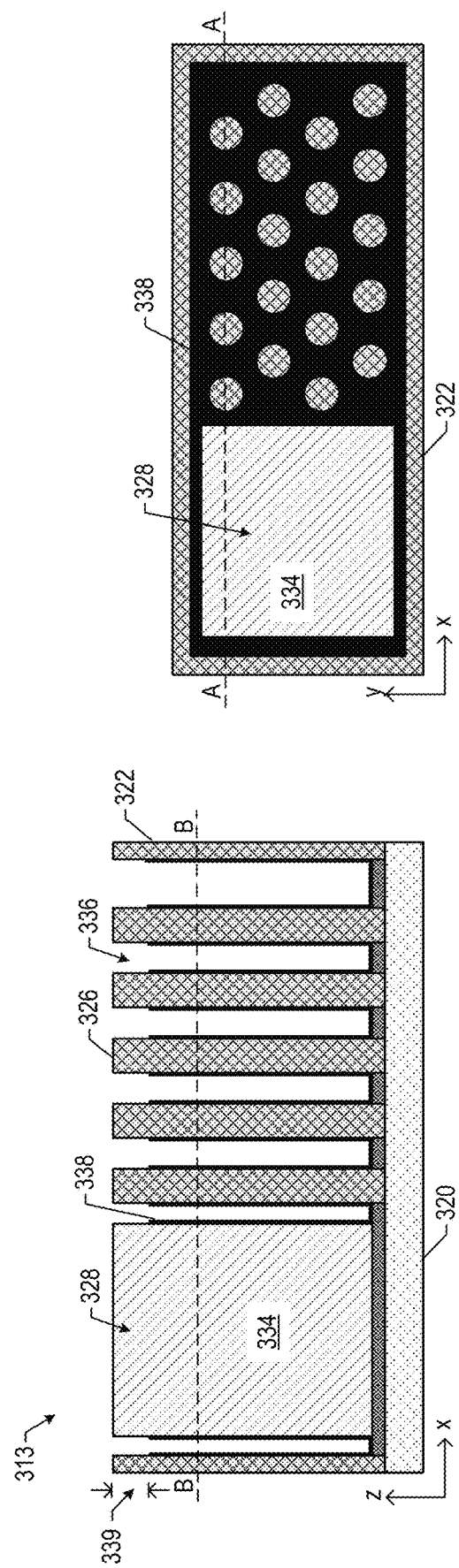

The fabrication method may then proceed with removing the upper portions of the electrically conductive material 338 from the IC device 312 (a process typically referred to as "etch-back" or "recess"). An example result of this is shown in FIG. 13, illustrating an IC device 313 that is substantially the same as the IC device 312 but with the electrically conductive material 338 removed from the top surfaces and the upper portions of the sidewalls of the studs 326 and the insulator material 334 in the socket 328. In some embodiments, a depth 339 of the recess of the electrically conductive material 338 may be between about 3 nanometer and 50 nanometers, including all ranges and values therein, e.g., between about 3 nanometers and 25 nanometers or between about 5 nanometers and 20 nanometers. In some embodiments, a depth 339 of the recess of the electrically conductive material 338 may be between about 2% and 50% of the height of the studs 326 (where the height may be substantially equal to the thickness 323 of the insulator material 322, described above), including all ranges and values therein, e.g., between about 5% and 25% or between about 5% and 20%. Any suitable etching technique may be used to perform the etch-back of the electrically conductive material 338, such as a timed etch. Provided that the electrically conductive material 338 has sufficient etch selectivity with the insulator material 322 of the studs 326 and the insulator material 334, etch-back of the electrically conductive material 338 should not substantially etch the insulator material 322 of the studs 326 and the insulator material 334.

FIGS. 14-19 have a different layout than FIGS. 3-13 in order to show larger versions of the IC devices so that the details may be clearly seen. Similar to FIGS. 3-13, each of FIGS. 14-19 still shows a cross-sectional side view of an x-z plane of the coordinate system 105 and a top-down view of an x-y plane of the coordinate system 105, where the cross-sectional side view is the view across an AA plane and the top-down view is the view across a BB plane shown in these drawings.

Figure 14:
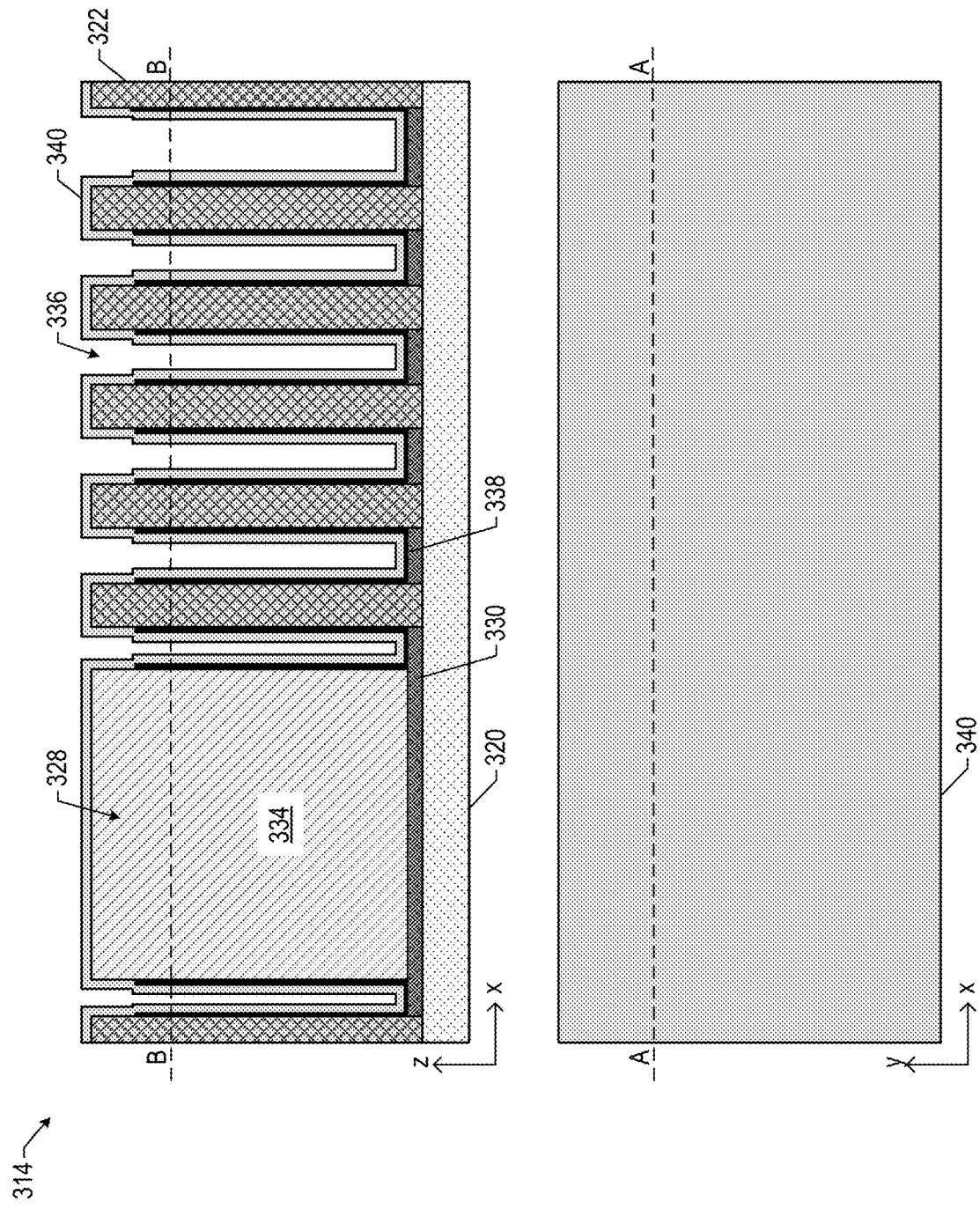

Following the etch-back of the electrically conductive material 338, the fabrication method may include depositing a layer of a capacitor insulator on all exposed surfaces of the IC device 313. An example result of this is shown in FIG. 14, illustrating an IC device 314 that is substantially the same as the IC device 313 but further includes a capacitor insulator 340 conformally deposited on all exposed surfaces (i.e., in and over the openings 336 lined with the etched-back electrically conductive material 338). In some embodiments, the capacitor insulator 340 may include any of the insulator materials described herein. In some embodiments, the capacitor insulator 340 may include a high-k dielectric material, e.g., any of the high-k dielectric material described with reference to the gate dielectric of the transistor 222 shown in FIG. 2. In some embodiments, a thickness of the capacitor insulator 340 may be between about 1 nanometer and 20 nanometers, including all ranges and values therein, e.g., between about 1 nanometer and 10 nanometers or between about 2 nanometers and 5 nanometers. Any suitable deposition technique may be used to provide a conformal layer of the capacitor insulator 340 of the IC device 314, e.g., ALD, CVD, or PVD.

Figure 15:
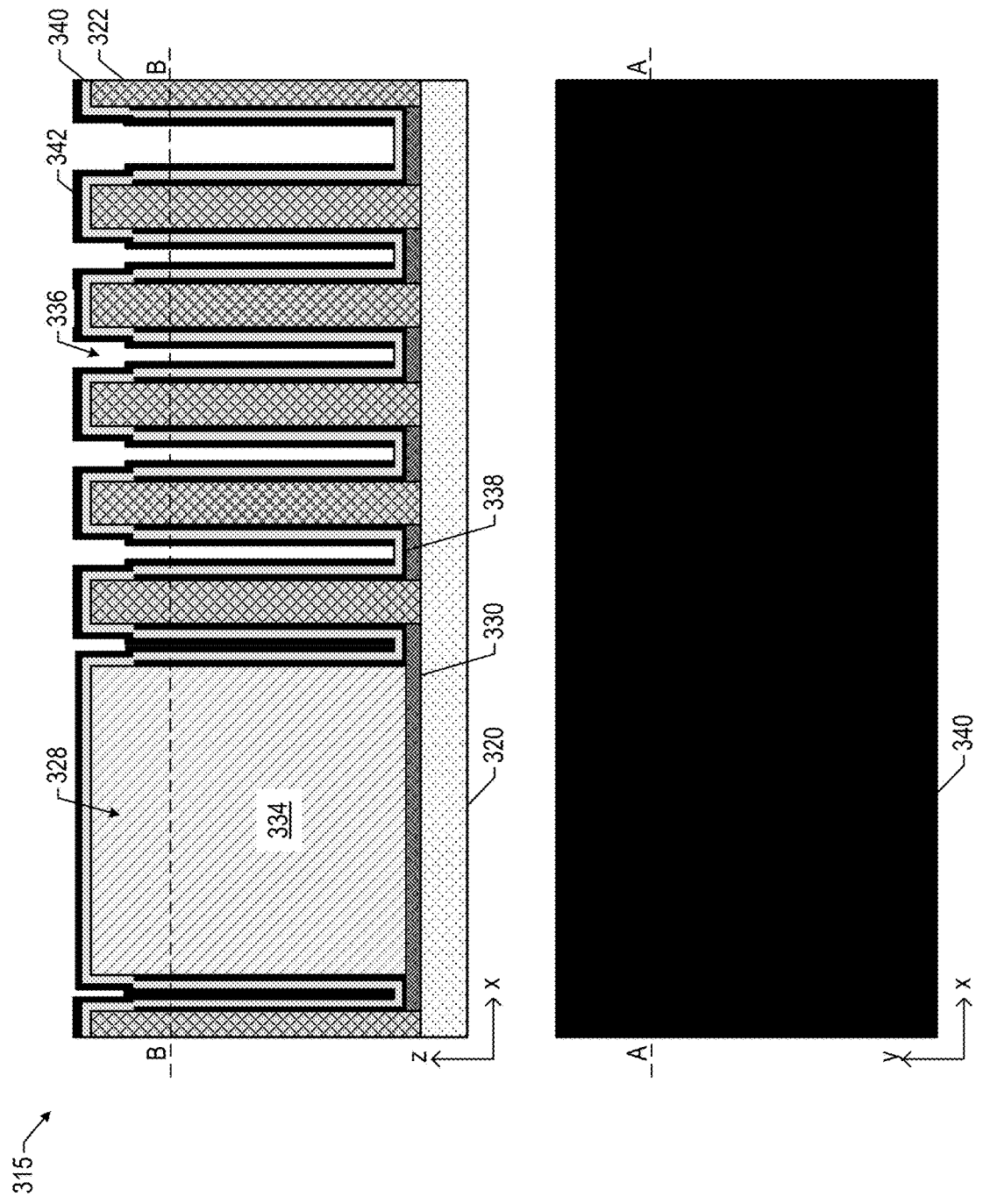

Next, the fabrication method may include depositing another layer of an electrically conductive material on all exposed surfaces of the IC device 314. An example result of this is shown in FIG. 15, illustrating an IC device 315 that is substantially the same as the IC device 314 but further includes an electrically conductive material 342 conformally deposited on all exposed surfaces (i.e., in and over the openings 336, conformal to the layer of the capacitor insulator 340). Thus, the capacitor insulator 340 separates the etched-back layer of the electrically conductive material 338 and the electrically conductive material 342. The electrically conductive material 342 on the sidewalls of the studs 326 and at the bottoms of the openings 336 between the studs 326 is a second capacitor electrode of the 3D MIM capacitor structures. In some embodiments, the electrically conductive material 342 may include any conductive metals, e.g., Cu, Al, W, or Co, or metal alloys, and may have a material composition that is either substantially the same as or different from that of the electrically conductive material 330 and/or that of the electrically conductive material 338. In some embodiments, a thickness of the electrically conductive material 342 may be between about 1 nanometer and 20 nanometers, including all ranges and values therein, e.g., between about 1 nanometer and 10 nanometers or between about 2 nanometers and 5 nanometers. Any suitable deposition technique may be used to provide a conformal layer of the electrically conductive material 342 of the IC device 315, e.g., ALD, CVD, or PVD.

Figure 16:
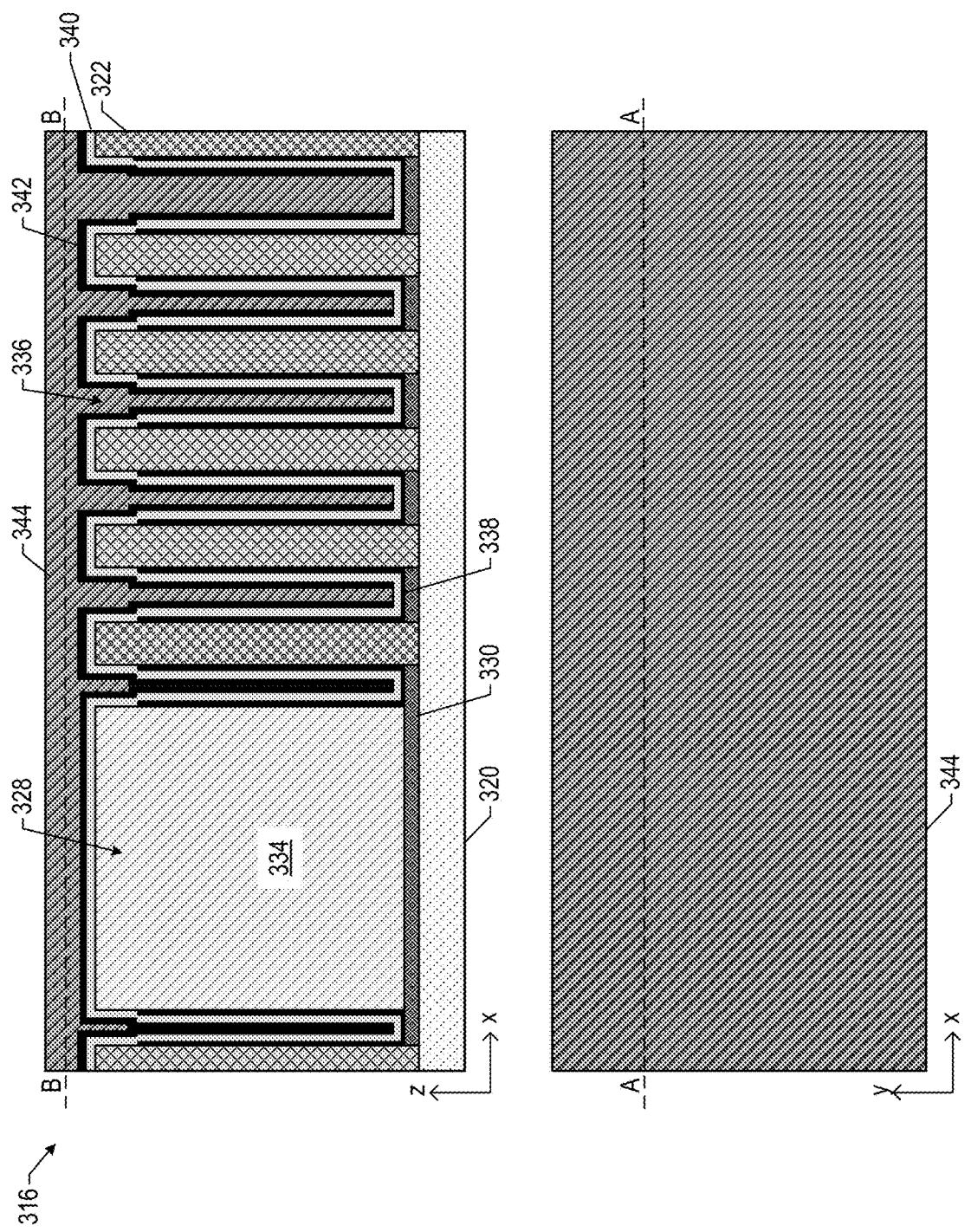

The fabrication method may then include depositing an electrically conductive fill material in all openings and over the IC device 315. An example result of this is shown in FIG. 16, illustrating an IC device 316 that is substantially the same as the IC device 315 but further includes an electrically conductive fill material 344 in the remaining space of the openings 336 (e.g. over and between the studs 326 and over and around the insulator material 334 in the socket 328). In some embodiments, the electrically conductive fill material 344 may include any electrically conductive materials described herein, e.g., Cu, Al, W, or Co, or metal alloys, and may have a material composition that is either substantially the same as or different from that of any one or more of the other electrically conductive materials of the IC device 316. Any suitable deposition technique may be used to deposit the electrically conductive fill material 344 of the IC device 316, such as ALD, CVD, or PVD.

Next, the fabrication method may include performing planarization to remove the excess amount of the electrically conductive fill material 344 as well as the electrically conductive material 342 and the capacitor insulator 340 on top of the studs 326 and on top of the insulator material 334 in the socket 328. To that end, a planarization process similar to that described above may be used. A result of the planarization is illustrated with an IC device 317 depicted in FIG. 17, where the IC device 317 is substantially the same as the IC device 316 but with the excess portions of the electrically conductive fill material 344 removed from the top. Furthermore, FIG. 17 illustrates that the electrically conductive material 342 and the capacitor insulator 340 on top of the studs 326 and on top of the insulator material 334 in the socket 328 are removed as well, exposing the upper surfaces of the studs 326 and the capacitor insulator 340 on the sidewalls of the studs 326.

Figure 17:
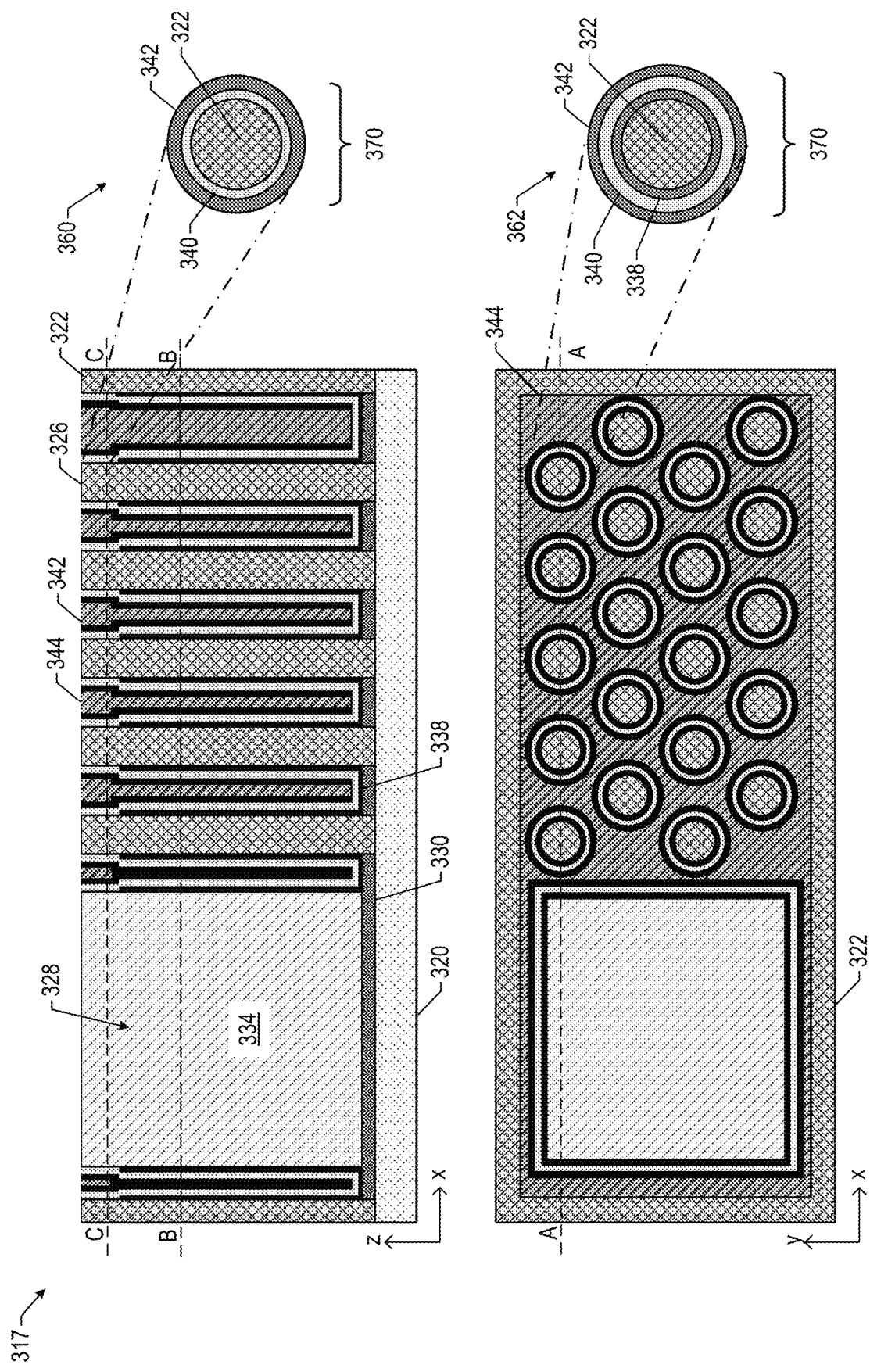

FIG. 17 further illustrates two insets, labeled as an inset 360 and an inset 362, illustrating an enlarged version of the top-down views at different cross-sections of the IC device 317. The inset 362 may be seen as a top-down view of one of the studs 326 with a cross-section taken along the plane BB as shown in FIG. 17. The inset 362 illustrates a 3D MIM capacitor structure 370 in which the insulator material 322 of the stud 326 is surrounded by the electrically conductive material 338, which is a first capacitor electrode of the 3D MIM capacitor structure 370. The inset 362 further illustrates that the electrically conductive material 338 is surrounded by the capacitor insulator 340, which is a capacitor insulator of the 3D MIM capacitor structure 370. The inset 362 also illustrates that the capacitor insulator 340 is surrounded by the electrically conductive material 342, which is a second capacitor electrode of the 3D MIM capacitor structure 370. The inset 360 may be seen as a top-down view of one of the studs 326 with a cross-section taken along the plane CC as shown in FIG. 17. The inset 360 illustrates an upper portion of the 3D MIM capacitor structure 370. In that portion, the electrically conductive material 338 was etched-back, so it is absent from the cross-section of the inset 360. The inset 360 illustrates that the insulator material 322 of the stud 326 is surrounded by the capacitor insulator 340, and that the capacitor insulator 340 is surrounded by the electrically conductive material 342. The 3D MIM capacitor structure 370 may be one example of any of the 3D MIM capacitor structures 250 of FIG. 2.

Figure 18:
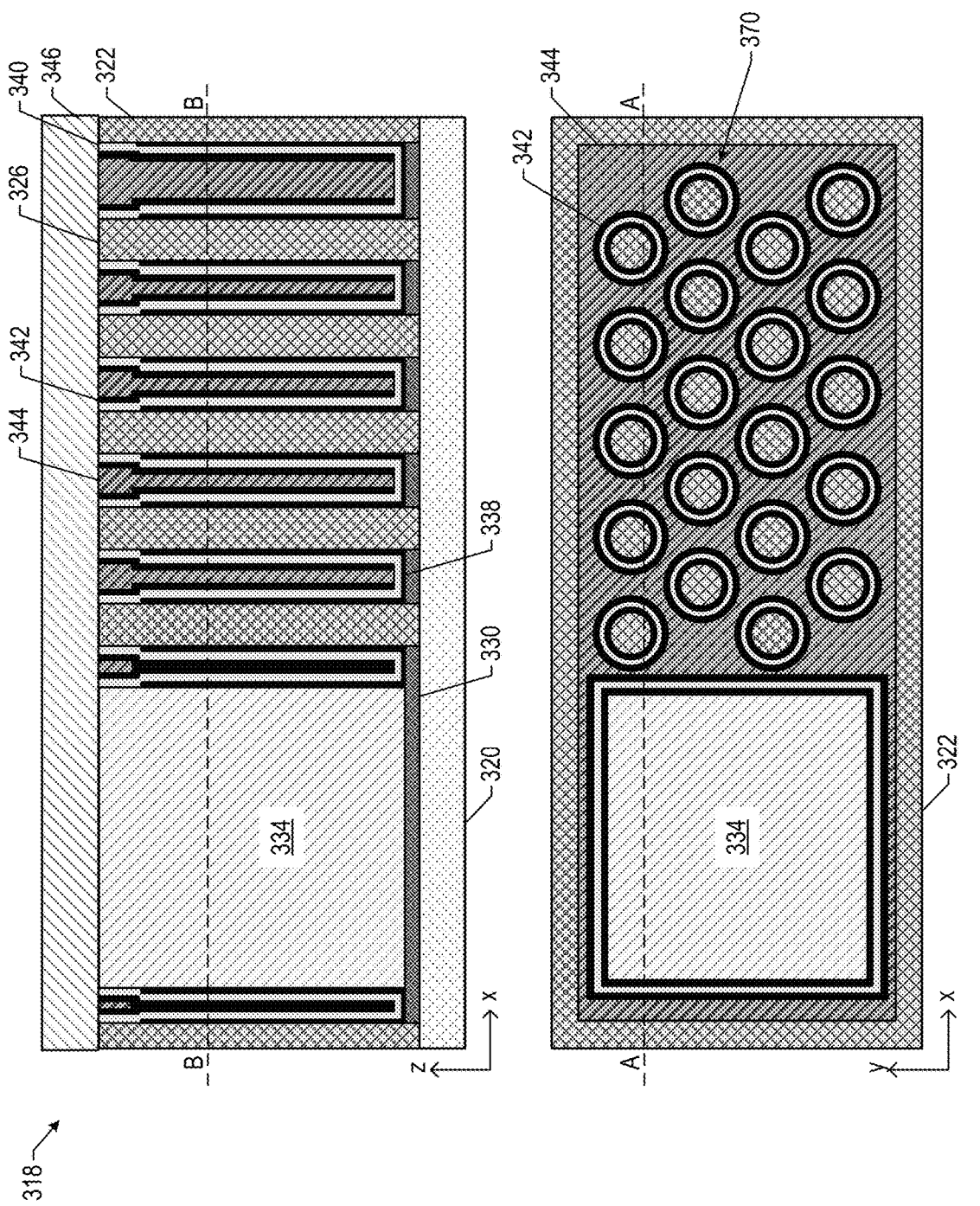

The fabrication method may also include depositing another insulator material over the IC device 317. An example result of this is shown in FIG. 18, illustrating an IC device 318 that is substantially the same as the IC device 317 but further includes an insulator material 346 deposited over the insulator material 334 in the socket 328 and over the studs 326. In some embodiments, the insulator material 346 may include any insulator materials described herein, e.g., any ILD materials described herein, and may have a material composition that is either substantially the same as or different from that of any one or more of the other insulator materials of the IC device 318. Any suitable deposition technique may be used to deposit the insulator material 346 of the IC device 318, such as ALD, CVD, PVD, spin-coating, or dip-coating.

Figure 19:
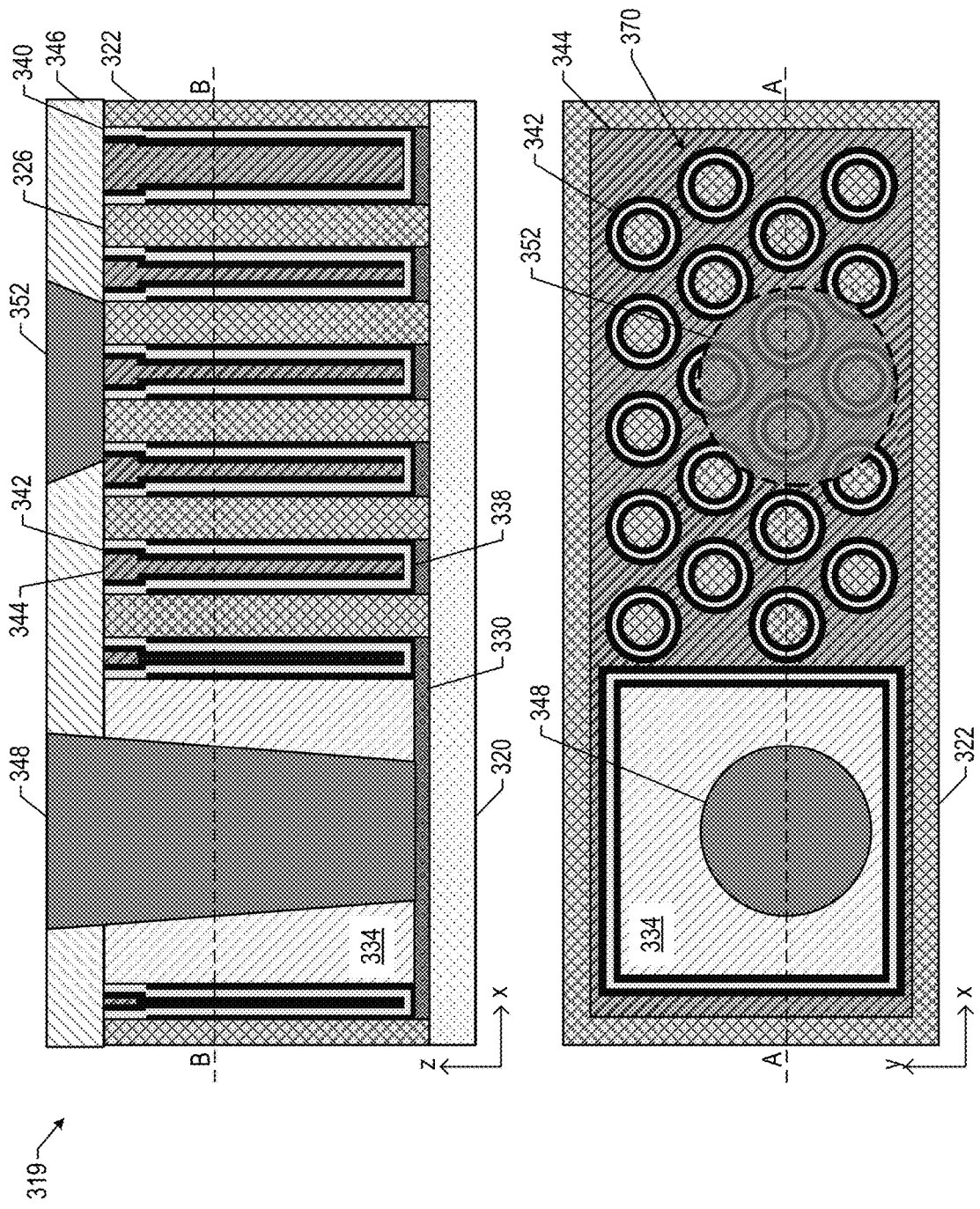

The fabrication method may further include patterning contacts to first and second capacitor electrodes. An example result of this is shown in FIG. 19, illustrating an IC device 319 that is substantially the same as the IC device 318 but further includes a first contact 348 and a second contact 352. The first contact 348 is an electrical contact to a first capacitor electrode formed by the electrically conductive material 330 in contact with the electrically conductive material 338. The second contact 352 is an electrical contact to a second capacitor electrode formed by the electrically conductive material 342. The top-down view of FIG. 19 illustrates the second contact 352 as a transparent overlay shown with a dotted circle to indicate that it is actually not present in the cross-section along the plane BB because it is above that plane. The reason why the second contact 352 is illustrated in the top-down view of FIG. 19 is to show how the second contact 352 is in conductive contact with the electrically conductive material 342 of all of the different 3D MIM capacitor structures 370, via the electrically conductive fill material 344 that electrically connects them together. Thus, the second capacitor electrodes of different ones of the 3D MIM capacitor structures 370, formed by the electrically conductive material 342, are electrically connected together, effectively acting as a single second capacitor electrode. Similarly, the top-down view of FIG. 6 illustrates how the electrically conductive material 330 surrounds different ones of the studs 326 which later form the foundation of the 3D MM capacitor structures 370. Because the first contact 348 is in contact (physical and electrical) with the electrically conductive material 330 in the socket 328, it is effectively in electrical contact with the electrically conductive material 330 under bottom portions of the electrically conductive material 338 between the studs 326. Thus, the first capacitor electrodes of different ones of the 3D MIM capacitor structures 370, formed by a combination of the electrically conductive material 330 and the electrically conductive material 338, are electrically connected together, effectively acting as a single first capacitor electrode. Any suitable patterning and deposition techniques, such as the ones described above, may be used to form the first contact 348 and the second contact 352. This effectively increases the surface area of first and second capacitor electrodes, advantageously resulting in larger capacitance.

FIG. 19 also illustrates how, because of the etch-back of the electrically conductive material 338 (described with reference to FIG. 13), the second contact 352 is not in contact with the electrically conductive material 338 of the first capacitor electrode. This is intended to be so in order to prevent shorting between the first and second capacitor electrodes.

Figure 21:
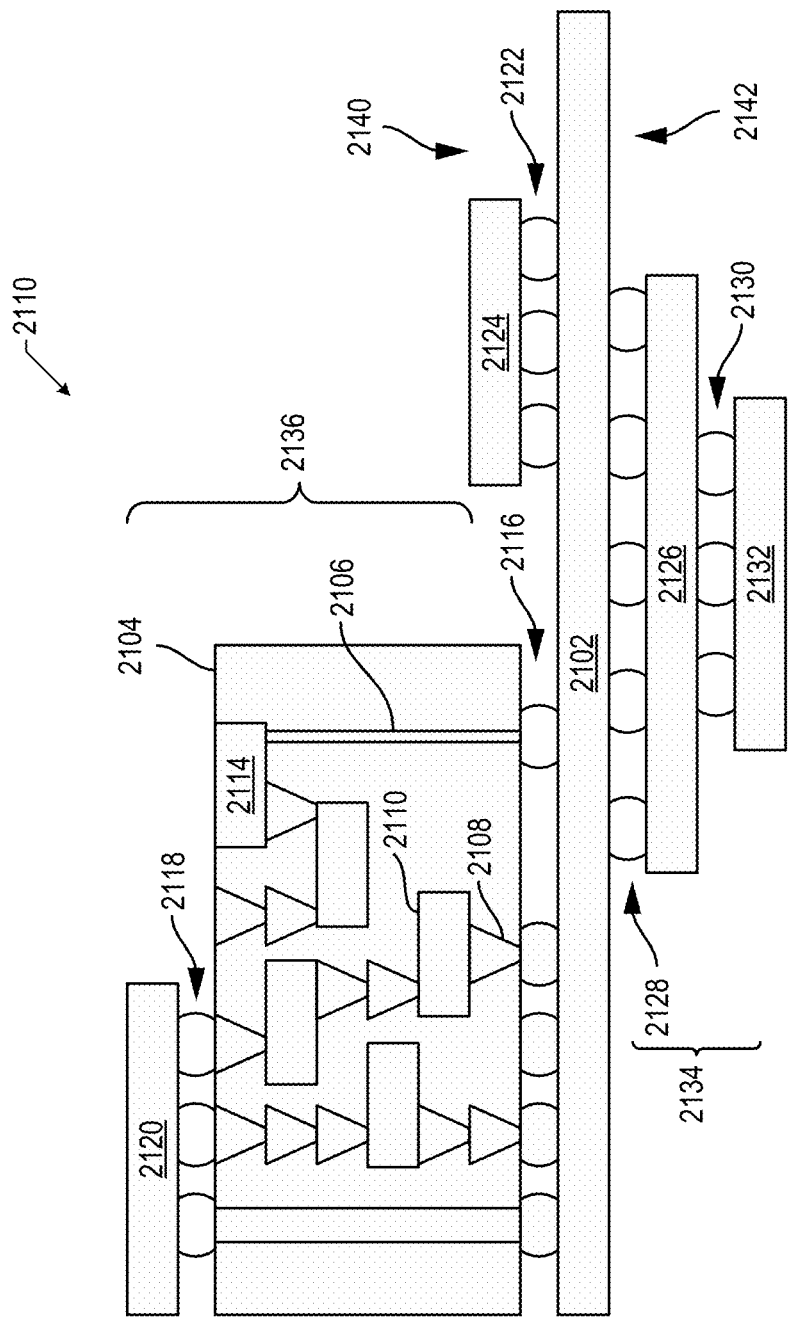
FIG. 21 illustrates a cross-sectional side view of an IC device assembly that may include one or more 3D MIM capacitor structures in accordance with any of the embodiments disclosed herein.
Figure 22:
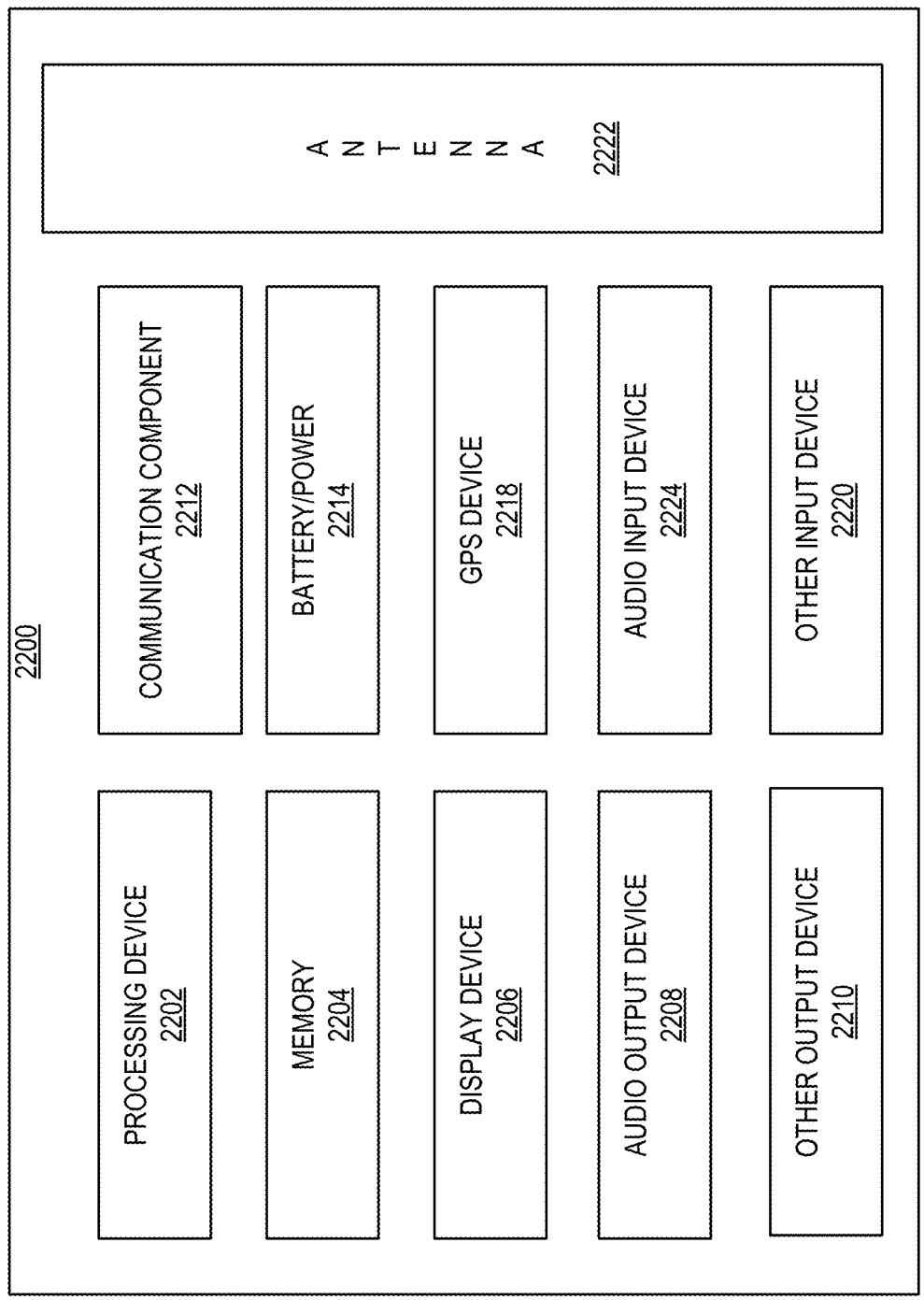
FIG. 22 illustrates a block diagram of an example computing device that may include one or more 3D MIM capacitor structures in accordance with any of the embodiments disclosed herein.

The IC structures with 3D MIM capacitor structures disclosed herein (e.g., with the 3D MIM capacitor structures 250/370) may be included in any suitable electronic device. FIGS. 20-22 illustrate various examples of apparatuses that may include one or more 3D MIM capacitor structures disclosed herein (e.g., one or more 3D MIM capacitor structures 250/370 according to any of the embodiments disclosed herein).

FIG. 20 illustrates top views of a wafer and dies that include one or more 3D MIM capacitor structures in accordance with any of the embodiments disclosed herein. The wafer 2000 may be composed of semiconductor material and may include one or more dies 2002 having IC structures formed on a surface of the wafer 2000. Each of the dies 2002 may be a repeating unit of a semiconductor product that includes any suitable IC structure (e.g., the IC structure with one or more 3D MIM capacitor structures). After the fabrication of the semiconductor product is complete (e.g., after manufacture of one or more IC structures with one or more 3D MIM capacitor structures as described herein, included in a particular IC device, e.g., in an IC device 100/200), the wafer 2000 may undergo a singulation process in which each of the dies 2002 is separated from one another to provide discrete "chips" of the semiconductor product. In particular, devices that include one or more IC structures with one or more 3D MIM capacitor structures as disclosed herein may take the form of the wafer 2000 (e.g., not singulated) or the form of the die 2002 (e.g., singulated). The die 2002 may include one or more transistors (e.g., one or more of the transistors 222 of FIG. 2, discussed below) and/or supporting circuitry to route electrical signals to the transistors, as well as any other IC components (e.g., one or more IC structures with one or more 3D MIM capacitor structures as discussed herein). In some embodiments, the wafer 2000 or the die 2002 may include a memory device (e.g., a static random-access memory (SRAM) device), a logic device (e.g., an AND, OR, NAND, or NOR gate), or any other suitable circuit element. Multiple ones of these devices may be combined on a single die 2002. For example, a memory array formed by multiple memory devices may be formed on a same die 2002 as a processing device (e.g., the processing device 2202 of FIG. 22) or other logic that is configured to store information in the memory devices or execute instructions stored in the memory array.

FIG. 21 illustrates a cross-sectional side view of an IC device assembly 2100 that may include components having or being associated with (e.g., being electrically connected by means of) one or more IC devices with one or more 3D MIM capacitor structures in accordance with any of the embodiments disclosed herein. The IC device assembly 2100 includes a number of components disposed on a circuit board 2102 (which may be, e.g., a motherboard). The IC device assembly 2100 includes components disposed on a first face 2140 of the circuit board 2102 and an opposing second face 2142 of the circuit board 2102; generally, components may be disposed on one or both faces 2140 and 2142. In particular, any suitable ones of the components of the IC device assembly 2100 may include any of the 3D MIM capacitor structures, disclosed herein.

In some embodiments, the circuit board 2102 may be a PCB including multiple metal layers separated from one another by layers of dielectric material and interconnected by electrically conductive vias. Any one or more of the metal layers may be formed in a desired circuit pattern to route electrical signals (optionally in conjunction with other metal layers) between the components coupled to the circuit board 2102. In other embodiments, the circuit board 2102 may be a non-PCB substrate.

The IC device assembly 2100 illustrated in FIG. 21 includes a package-on-interposer structure 2136 coupled to the first face 2140 of the circuit board 2102 by coupling components 2116. The coupling components 2116 may electrically and mechanically couple the package-on-interposer structure 2136 to the circuit board 2102, and may include solder balls (as shown in FIG. 21), male and female portions of a socket, an adhesive, an underfill material, and/or any other suitable electrical and/or mechanical coupling structure.

The package-on-interposer structure 2136 may include an IC package 2120 coupled to an interposer 2104 by coupling components 2118. The coupling components 2118 may take any suitable form for the application, such as the forms discussed above with reference to the coupling components 2116. Although a single IC package 2120 is shown in FIG. 21, multiple IC packages may be coupled to the interposer 2104; indeed, additional interposers may be coupled to the interposer 2104. The interposer 2104 may provide an intervening substrate used to bridge the circuit board 2102 and the IC package 2120. The IC package 2120 may be or include, for example, a die (the die 2002 of FIG. 20), an IC device (e.g., the IC device 200 of FIG. 2), or any other suitable component. In some embodiments, the IC package 2120 may include one or more 3D MIM capacitor structures, as described herein. Generally, the interposer 2104 may spread a connection to a wider pitch or reroute a connection to a different connection. For example, the interposer 2104 may couple the IC package 2120 (e.g., a die) to a ball grid array (BGA) of the coupling components 2116 for coupling to the circuit board 2102. In the embodiment illustrated in FIG. 21, the IC package 2120 and the circuit board 2102 are attached to opposing sides of the interposer 2104; in other embodiments, the IC package 2120 and the circuit board 2102 may be attached to a same side of the interposer 2104. In some embodiments, three or more components may be interconnected by way of the interposer 2104.

The interposer 2104 may be formed of an epoxy resin, a fiberglass-reinforced epoxy resin, a ceramic material, or a polymer material such as polyimide. In some implementations, the interposer 2104 may be formed of alternate rigid or flexible materials that may include the same materials described above for use in a semiconductor substrate, such as silicon, germanium, and other group III-V and group IV materials. The interposer 2104 may include metal interconnects 2108 and vias 2110, including but not limited to TSVs 2106. The interposer 2104 may further include embedded devices 2114, including both passive and active devices. Such devices may include, but are not limited to, capacitors, decoupling capacitors, resistors, inductors, fuses, diodes, transformers, sensors, electrostatic discharge (ESD) devices, and memory devices. More complex devices such as RF devices, power amplifiers, power management devices, antennas, arrays, sensors, and microelectromechanical systems (MEMS) devices may also be formed on the interposer 2104. The interposer 2104 may further include one or more 3D MIM capacitor structures as described herein. The package-on-interposer structure 2136 may take the form of any of the package-on-interposer structures known in the art.

The IC device assembly 2100 may include an IC package 2124 coupled to the first face 2140 of the circuit board 2102 by coupling components 2122. The coupling components 2122 may take the form of any of the embodiments discussed above with reference to the coupling components 2116, and the IC package 2124 may take the form of any of the embodiments discussed above with reference to the IC package 2120.

The IC device assembly 2100 illustrated in FIG. 21 includes a package-on-package structure 2134 coupled to the second face 2142 of the circuit board 2102 by coupling components 2128. The package-on-package structure 2134 may include an IC package 2126 and an IC package 2132 coupled together by coupling components 2130 such that the IC package 2126 is disposed between the circuit board 2102 and the IC package 2132. The coupling components 2128 and 2130 may take the form of any of the embodiments of the coupling components 2116 discussed above, and the IC packages 2126 and 2132 may take the form of any of the embodiments of the IC package 2120 discussed above. The package-on-package structure 2134 may be configured in accordance with any of the package-on-package structures known in the art.

FIG. 22 illustrates a block diagram of an example computing device 2200 that may include one or more components including one or more IC devices with one or more 3D MIM capacitor structures 250/370 in accordance with any of the embodiments disclosed herein. For example, any suitable ones of the components of the computing device 2200 may include a die (e.g., the die 2002 of FIG. 20) having one or more 3D MIM capacitor structures 250/370 as described herein. Any one or more of the components of the computing device 2200 may include, or be included in, an IC device 200 of FIG. 2. Any one or more of the components of the computing device 2200 may include, or be included in, an IC device assembly 2100 of FIG. 21.

A number of components are illustrated in FIG. 22 as included in the computing device 2200, but any one or more of these components may be omitted or duplicated, as suitable for the application. In some embodiments, some or all of the components included in the computing device 2200 may be attached to one or more motherboards. In some embodiments, some or all of these components are fabricated onto a single system-on-a-chip (SoC) die.

Additionally, in various embodiments, the computing device 2200 may not include one or more of the components illustrated in FIG. 22, but the computing device 2200 may include interface circuitry for coupling to the one or more components. For example, the computing device 2200 may not include a display device 2206, but may include display device interface circuitry (e.g., a connector and driver circuitry) to which a display device 2206 may be coupled. In another set of examples, the computing device 2200 may not include an audio input device 2224 or an audio output device 2208, but may include audio input or output device interface circuitry (e.g., connectors and supporting circuitry) to which an audio input device 2224 or audio output device 2208 may be coupled.

The computing device 2200 may include a processing device 2202 (e.g., one or more processing devices). As used herein, the term "processing device" or "processor" may refer to any device or portion of a device that processes electronic data from registers and/or memory to transform that electronic data into other electronic data that may be stored in registers and/or memory. The processing device 2202 may include one or more digital signal processors (DSPs), application-specific ICs (ASICs), central processing units (CPUs), graphics processing units (GPUs), cryptoprocessors (specialized processors that execute cryptographic algorithms within hardware), server processors, or any other suitable processing devices. The computing device 2200 may include a memory 2204, which may itself include one or more memory devices such as volatile memory (e.g., dynamic random-access memory (DRAM)), nonvolatile memory (e.g., read-only memory (ROM)), flash memory, solid state memory, and/or a hard drive. In some embodiments, the memory 2204 may include memory that shares a die with the processing device 2202. This memory may be used as cache memory and may include embedded dynamic random-access memory (eDRAM) or spin transfer torque magnetic random-access memory (STT-MRAM).

In some embodiments, the computing device 2200 may include a communication chip 2212 (e.g., one or more communication chips). For example, the communication chip 2212 may be configured for managing wireless communications for the transfer of data to and from the computing device 2200. The term "wireless" and its derivatives may be used to describe circuits, devices, systems, methods, techniques, communications channels, etc., that may communicate data through the use of modulated electromagnetic radiation through a nonsolid medium. The term does not imply that the associated devices do not contain any wires, although in some embodiments they might not.

The communication chip 2212 may implement any of a number of wireless standards or protocols, including but not limited to Institute for Electrical and Electronic Engineers (IEEE) standards including Wi-Fi (IEEE 802.11 family), IEEE 802.16 standards (e.g., IEEE 802.16-2005 Amendment), Long-Term Evolution (LTE) project along with any amendments, updates, and/or revisions (e.g., advanced LTE project, ultramobile broadband (UMB) project (also referred to as "3GPP2"), etc.). IEEE 802.16 compatible Broadband Wireless Access (BWA) networks are generally referred to as WiMAX networks, an acronym that stands for Worldwide Interoperability for Microwave Access, which is a certification mark for products that pass conformity and interoperability tests for the IEEE 802.16 standards. The communication chip 2212 may operate in accordance with a Global System for Mobile Communication (GSM), General Packet Radio Service (GPRS), Universal Mobile Telecommunications System (UMTS), High Speed Packet Access (HSPA), Evolved HSPA (E-HSPA), or LTE network. The communication chip 2212 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). The communication chip 2212 may operate in accordance with Code Division Multiple Access (CDMA), Time Division Multiple Access (TDMA), Digital Enhanced Cordless Telecommunications (DECT), Evolution-Data Optimized (EV-DO), and derivatives thereof, as well as any other wireless protocols that are designated as 3G, 20G, 21G, and beyond. The communication chip 2212 may operate in accordance with other wireless protocols in other embodiments. The computing device 2200 may include an antenna 2222 to facilitate wireless communications and/or to receive other wireless communications (such as AM or FM radio transmissions).

In some embodiments, the communication chip 2212 may manage wired communications, such as electrical, optical, or any other suitable communication protocols (e.g., the Ethernet). As noted above, the communication chip 2212 may include multiple communication chips. For instance, a first communication chip 2212 may be dedicated to shorter-range wireless communications such as Wi-Fi or Bluetooth, and a second communication chip 2212 may be dedicated to longer-range wireless communications such as global positioning system (GPS), EDGE, GPRS, CDMA, WiMAX, LTE, EV-DO, or others. In some embodiments, a first communication chip 2212 may be dedicated to wireless communications, and a second communication chip 2212 may be dedicated to wired communications.

The computing device 2200 may include battery/power circuitry 2214. The battery/power circuitry 2214 may include one or more energy storage devices (e.g., batteries or capacitors) and/or circuitry for coupling components of the computing device 2200 to an energy source separate from the computing device 2200 (e.g., AC line power).

The computing device 2200 may include a display device 2206 (or corresponding interface circuitry, as discussed above). The display device 2206 may include any visual indicators, such as a heads-up display, a computer monitor, a projector, a touchscreen display, a liquid crystal display (LCD), a light-emitting diode display, or a flat panel display, for example.

The computing device 2200 may include an audio output device 2208 (or corresponding interface circuitry, as discussed above). The audio output device 2208 may include any device that generates an audible indicator, such as speakers, headsets, or earbuds, for example.

The computing device 2200 may include an audio input device 2224 (or corresponding interface circuitry, as discussed above). The audio input device 2224 may include any device that generates a signal representative of a sound, such as microphones, microphone arrays, or digital instruments (e.g., instruments having a musical instrument digital interface (MIDI) output).

The computing device 2200 may include a GPS device 2218 (or corresponding interface circuitry, as discussed above). The GPS device 2218 may be in communication with a satellite-based system and may receive a location of the computing device 2200, as known in the art.

The computing device 2200 may include an other output device 2210 (or corresponding interface circuitry, as discussed above). Examples of the other output device 2210 may include an audio codec, a video codec, a printer, a wired or wireless transmitter for providing information to other devices, or an additional storage device.

The computing device 2200 may include an other input device 2220 (or corresponding interface circuitry, as discussed above). Examples of the other input device 2220 may include an accelerometer, a gyroscope, a compass, an image capture device, a keyboard, a cursor control device such as a mouse, a stylus, a touchpad, a bar code reader, a Quick Response (QR) code reader, any sensor, or a radio frequency identification (RFID) reader.

The computing device 2200 may have any desired form factor, such as a handheld or mobile computing device (e.g., a cell phone, a smart phone, a mobile internet device, a music player, a tablet computer, a laptop computer, a netbook computer, an ultrabook computer, a personal digital assistant (PDA), an ultramobile personal computer, etc.), a desktop computing device, a server or other networked computing component, a printer, a scanner, a monitor, a set-top box, an entertainment control unit, a vehicle control unit, a digital camera, a digital video recorder, or a wearable computing device. In some embodiments, the computing device 2200 may be any other electronic device that processes data.

SELECT EXAMPLES

The following paragraphs provide various examples of the embodiments disclosed herein.

Example 1 provides an IC device that includes a support structure (e.g., a substrate, a die, a wafer, or a chip); studs of a first insulator material (e.g., an insulator material 322) over the support structure; an insulator material (e.g., a capacitor insulator 340) surrounding and in contact with upper-most portions of sidewalls of the studs; a first electrically conductive material (e.g., an electrically conductive material 330) surrounding bottom-most portions of the sidewalls of the studs; a second electrically conductive material (e.g., an electrically conductive material 338) surrounding middle portions of the sidewalls of the studs, where the middle portions are between the bottom-most portions and the upper-most portions, where the insulator material further surrounds the second electrically conductive material over the middle portions of the sidewalls of the studs; and a third electrically conductive material (e.g., an electrically conductive material 342) surrounding the insulator material surrounding the middle portions and the upper-most portions of the studs.

Example 2 provides the IC device according to example 1, where a height of the upper-most portions of the sidewalls of the studs is less than about 50% of a height of the studs.

Example 3 provides the IC device according to examples 1 or 2, further including a fourth electrically conductive material (e.g., an electrically conductive material 344) between the middle portions of the sidewalls of the studs.

Example 4 provides the IC device according to example 3, where, for the middle portions of the sidewalls of the studs, the third electrically conductive material is between the insulator material and the fourth electrically conductive material.

Example 5 provides the IC device according to examples 3 or 4, for the middle portions of the sidewalls of the studs, the insulator material is between the second electrically conductive material and the third electrically conductive material.

Example 6 provides the IC device according to any one of examples 3-5, where, for the middle portions of the sidewalls of the studs, the second electrically conductive material is between the sidewalls of the studs and the insulator material.

Example 7 provides the IC device according to any one of examples 3-6, where, for the middle portions of the sidewalls of the studs, the fourth electrically conductive material is between the third electrically conductive material over a sidewall of one of the studs and the third electrically conductive material over a sidewall of another one of the studs.

Example 8 provides the IC device according to any one of examples 3-7, where the fourth electrically conductive material is further between the upper-most portions of the sidewalls of the studs.

Example 9 provides the IC device according to example 8, where, for the upper-most portions of the sidewalls of the studs, the insulator material is between the sidewalls of the studs and the fourth electrically conductive material.

Example 10 provides the IC device according to examples 8 or 9, where, for the upper-most portions of the sidewalls of the studs, the fourth electrically conductive material is between the third electrically conductive material over a sidewall of one of the studs and the third electrically conductive material over a sidewall of another one of the studs.

Example 11 provides the IC device according to any one of examples 3-10, where the fourth electrically conductive material is in contact with the third electrically conductive material.

Example 12 provides the IC device according to any one of the preceding examples, where bottom portions of the second electrically conductive material are in contact with the first electrically conductive material.

Example 13 provides the IC device according to any one of the preceding examples, where the studs are insulator studs.

Example 14 provides an IC device that includes a support structure (e.g., a substrate, a die, a wafer, or a chip); a pillar of a first insulator material over the support structure, the pillar including a first portion, a second portion, and a third portion, where the first portion is a portion closest to the support structure, and the second portion is between the first portion and the third portion; a first electrically conductive material (e.g., an electrically conductive material 330) surrounding the first portion; a second electrically conductive material (e.g., an electrically conductive material 338) in contact with the second portion; a second insulator material (e.g., a capacitor insulator 340) in contact with the third portion and in contact with the conformal layer of the second electrically conductive material in contact with the second portion; and a third electrically conductive material (e.g., an electrically conductive material 342) in contact with the layer of the second insulator material.

Example 15 provides the IC device according to example 14, where the second electrically conductive material is a layer of the second electrically conductive material conformal to sidewalls of the second portion of the pillar.

Example 16 provides the IC device according to examples 14 or 15, where the second insulator material is a layer of the second insulator material conformal to sidewalls of the third portion of the pillar and to the second electrically conductive material conformal to the sidewalls of the second portion of the pillar.

Example 17 provides the IC device according to any one of examples 14-16, where a height of the third portion of the pillar is less than about 20% of a total height of the pillar.

Example 18 provides the IC device according to any one of examples 14-17, where none of the first electrically conductive material is in contact with sidewalls of the third portion.

Example 19 provides an IC package that includes an IC device according to any one of the preceding examples; and a further component, coupled to the IC device.

Example 20 provides the IC package according to example 19, where the further component is or includes one of a package substrate, an interposer, or a further IC die.

In various further examples of the IC package according to examples 19 or 20, the further component may be coupled to the IC die via one or more first-level interconnects, where the one or more first-level interconnects may include one or more solder bumps, solder posts, or bond wires.

In further examples of the IC package according to any of the preceding examples, the IC die includes, or is a part of, at least one of a memory device, a computing device, a wearable device, a handheld electronic device, and a wireless communications device.

Example 21 provides an electronic device that includes a carrier substrate; and one or more of the IC device according to any one of the preceding examples and the IC package according to any one of the preceding examples, coupled to the carrier substrate.

Example 22 provides the electronic device according to example 21, where the carrier substrate is a motherboard.

Example 23 provides the electronic device according to example 21, where the carrier substrate is a PCB.

Example 24 provides the electronic device according to any one of examples 21-23, where the electronic device is a wearable electronic device (e.g., a smart watch) or handheld electronic device (e.g., a mobile phone).

Example 25 provides the electronic device according to any one of examples 21-24, where the electronic device further includes one or more communication chips and an antenna.

Example 26 provides the electronic device according to any one of examples 21-25, where the electronic device is a memory device.

Example 27 provides the electronic device according to any one of examples 21-25, where the electronic device is one of an RF transceiver, a switch, a power amplifier, a low-noise amplifier, a filter, a filter bank, a duplexer, an upconverter, or a downconverter of an RF communications device, e.g., of an RF transceiver.

Example 28 provides the electronic device according to any one of examples 21-25, where the electronic device is a computing device.

Example 29 provides the electronic device according to any one of examples 21-28, where the electronic device is included in a base station of a wireless communication system.

Example 30 provides the electronic device according to any one of examples 21-28, where the electronic device is included in a user equipment device (i.e., a mobile device) of a wireless communication system.

The above description of illustrated implementations of the disclosure, including what is described in the Abstract, is not intended to be exhaustive or to limit the disclosure to the precise forms disclosed. While specific implementations of, and examples for, the disclosure are described herein for illustrative purposes, various equivalent modifications are possible within the scope of the disclosure, as those skilled in the relevant art will recognize. These modifications may be made to the disclosure in light of the above detailed description.

The invention claimed is:

1. An integrated circuit (IC) device, comprising:
a substrate;
studs over the substrate;
an insulator material surrounding and in contact with upper-most portions of sidewalls of the studs;
a first electrically conductive material surrounding bottom-most portions of the sidewalls of the studs;
a second electrically conductive material surrounding middle portions of the sidewalls of the studs, wherein the middle portions are between the bottom-most portions and the upper-most portions, wherein the insulator material further surrounds the second electrically conductive material over the middle portions of the sidewalls of the studs; and
a third electrically conductive material surrounding the insulator material surrounding the middle portions and the upper-most portions of the studs.

2. The IC device according to claim 1, wherein a height of the upper-most portions of the sidewalls of the studs is less than about 50% of a height of the studs.

3. The IC device according to claim 1, further comprising a fourth electrically conductive material between the middle portions of the sidewalls of the studs.

4. The IC device according to claim 3, wherein, for the middle portions of the sidewalls of the studs, the third electrically conductive material is between the insulator material and the fourth electrically conductive material.

5. The IC device according to claim 3, for the middle portions of the sidewalls of the studs, the insulator material is between the second electrically conductive material and the third electrically conductive material.

6. The IC device according to claim 3, wherein, for the middle portions of the sidewalls of the studs, the second electrically conductive material is between the sidewalls of the studs and the insulator material.

7. The IC device according to claim 3, wherein, for the middle portions of the sidewalls of the studs, the fourth electrically conductive material is between the third electrically conductive material over a sidewall of one of the studs and the third electrically conductive material over a sidewall of another one of the studs.

8. The IC device according to claim 3, wherein the fourth electrically conductive material is further between the upper-most portions of the sidewalls of the studs.

9. The IC device according to claim 8, wherein, for the upper-most portions of the sidewalls of the studs, the insulator material is between the sidewalls of the studs and the fourth electrically conductive material.

10. The IC device according to claim 8, wherein, for the upper-most portions of the sidewalls of the studs, the fourth electrically conductive material is between the third electrically conductive material over a sidewall of one of the studs and the third electrically conductive material over a sidewall of another one of the studs.

11. The IC device according to claim 3, wherein the fourth electrically conductive material is in contact with the third electrically conductive material.

12. The IC device according to claim 1, wherein bottom portions of the second electrically conductive material are in contact with the first electrically conductive material.

13. The IC device according to claim 1, wherein the studs are insulator studs.

14. An integrated circuit (IC) device, comprising:
a die;
a pillar of a first insulator material over the die, the pillar comprising a first portion, a second portion, and a third portion, wherein the first portion is a portion closest to the die, and the second portion is between the first portion and the third portion;

a first electrically conductive material surrounding the first portion;
a second electrically conductive material in contact with the second portion;
a second insulator material in contact with the third portion and in contact with the second electrically conductive material; and
a third electrically conductive material in contact with the second insulator material.

15. The IC device according to claim 14, wherein the second electrically conductive material is a layer of the second electrically conductive material conformal to sidewalls of the second portion of the pillar.

16. The IC device according to claim 15, wherein the second insulator material is a layer of the second insulator material conformal to sidewalls of the third portion of the pillar and to the second electrically conductive material conformal to the sidewalls of the second portion of the pillar.

17. The IC device according to claim 14, wherein a height of the third portion of the pillar is less than about 20% of a total height of the pillar.

18. The IC device according to claim 14, wherein none of the first electrically conductive material is in contact with sidewalls of the third portion.

19. An integrated circuit (IC) package, comprising:
an IC die; and
a further component, coupled to the IC die,
wherein the IC die includes:
 a pillar of an insulator material extending away from the die, the pillar comprising a first portion, a second portion, and a third portion, wherein the first portion is a portion closest to the IC die, and the second portion is between the first portion and the third portion, and
 a capacitor structure on sidewalls of the second portion, the capacitor structure comprising a first capacitor electrode in contact with the sidewalls of the second portion, a second capacitor electrode, and a capacitor insulator between the first capacitor electrode and the second capacitor electrode,
 wherein the capacitor insulator is in contact with sidewalls of the third portion.

20. The IC package according to claim 19, wherein the further component is one of a package substrate, an interposer, or a further IC die.

* * * * *